United States Patent
Kimino

(10) Patent No.: US 7,651,724 B2
(45) Date of Patent: Jan. 26, 2010

(54) APPARATUS AND METHOD FOR MANUFACTURING SEMICONDUCTOR DEVICE

(75) Inventor: Kazunari Kimino, Nishinomiya (JP)

(73) Assignee: Ricoh Comapny, Ltd., Tokyo (JP)

( * ) Notice: Subject to any disclaimer, the term of this patent is extended or adjusted under 35 U.S.C. 154(b) by 278 days.

(21) Appl. No.: 11/399,315

(22) Filed: Apr. 7, 2006

(65) Prior Publication Data

US 2007/0116863 A1    May 24, 2007

Related U.S. Application Data

(62) Division of application No. 10/609,634, filed on Jul. 1, 2003.

(30) Foreign Application Priority Data

Jul. 3, 2002    (JP) ............................. 2002-195185

(51) Int. Cl.
*H05K 3/28*    (2006.01)

(52) U.S. Cl. ...................... 427/96.4; 427/256; 427/384; 427/427.2

(58) Field of Classification Search .................. 118/666, 118/667, 669, 679, 680, 677; 427/96.4, 256, 427/384, 427.2
See application file for complete search history.

(56) References Cited

U.S. PATENT DOCUMENTS

| | | | |
|---|---|---|---|
| 5,711,989 A | 1/1998 | Ciardella et al. | |
| 5,906,682 A * | 5/1999 | Bouras et al. | 118/712 |
| 5,935,375 A | 8/1999 | Nakazawa et al. | |
| 6,007,631 A | 12/1999 | Prentice et al. | |
| 6,017,392 A | 1/2000 | Cavallaro | |
| 6,150,194 A * | 11/2000 | Sakaguchi et al. | 438/118 |
| 6,713,880 B2 * | 3/2004 | Sahara et al. | 257/783 |

FOREIGN PATENT DOCUMENTS

| | | |
|---|---|---|
| JP | 7-161764 | 6/1995 |
| JP | 2000-260910 | 9/2000 |
| JP | 2001-55432 | 2/2001 |

* cited by examiner

*Primary Examiner*—George R Koch, III
(74) *Attorney, Agent, or Firm*—Dickstein Shapiro LLP

(57) ABSTRACT

An apparatus and a method for manufacturing semiconductor devices implemented with improved steps of forming a sealant resin layer on the surface of a wafer substrate provided thereon with protruded electrodes. Through process steps of sending driving signals to a stage unit and discharging head based on the comparison with stage position information from stage position detector, and controlling the position of a substrate holding unit with the suction held semiconductor wafer substrate and the scanning movements of discharging mechanism such that minute liquid droplets of raw sealant resin are suitably discharged from discharging head, a raw sealant resin layer is formed on the surface the wafer substrate except the area for forming bump electrodes. The raw sealant resin layer is subsequently hardened to form a sealant resin layer. The reduction of manufacturing costs, and more precise control of location and thickness of the sealant resin become feasible by the method disclosed herein.

5 Claims, 16 Drawing Sheets

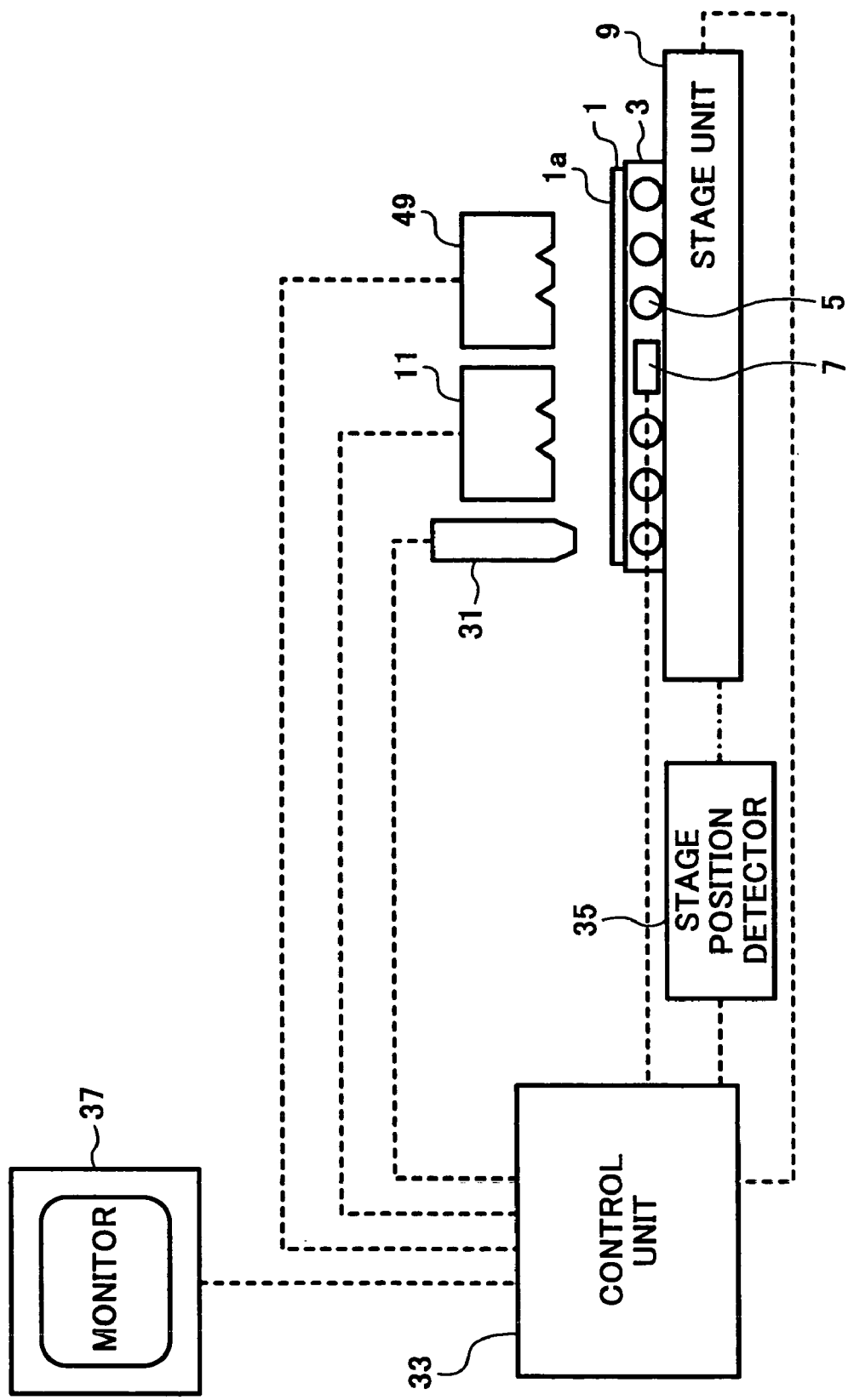

APPARATUS AND METHOD FOR MANUFACTURING SEMICONDUCTOR DEVICE

CROSS-REFERENCE TO RELATED APPLICATION

This application is a divisional of U.S. patent application Ser. No. 10/609,634, filed on Jul. 1, 2003, the subject matter of which is incorporated in its entirety by reference herein.

FIELD OF THE INVENTION

This patent specification relates to an apparatus and a method for manufacturing semiconductor devices, and more particularly, to such apparatus and method implemented with improved steps of forming a sealant resin layer on the surface of a wafer substrate provided thereon with electrodes.

BACKGROUND OF THE INVENTION

This document claims priority and contains subject matter related to Japanese Patent Application No. 2002-195185, filed with the Japanese Patent Office on Jul. 3, 2002, the entire contents of which are hereby incorporated by reference.

The apparatus and method as well as materials used in the resin sealing play important roles in electronic device packaging. A method is known for forming a layer of sealant resin on the surface of a semiconductor wafer substrate provided with a protruded electrode, in which several steps are proceeded such as forming first a coating layer at the tip of the protruded electrode, forming a layer of raw sealant resin over the substrate so as the tip of the protruded electrode be exposed afterwards, hardening the layer to form a sealant resin layer, and removing the coating layer (Japanese Laid-Open Patent Application No. 7-161764).

In a further method previously known, a metal mold is formed to arrange therein a semiconductor wafer substrate, sealant resin tablets, and temporary films for preventing the resin from sticking to the mold. By subsequent heating under pressurization, the resin is spread over the wafer substrate to form a sealant resin layer (Japanese Laid-Open Patent Application No. 2001-55432). In this method the sealant resin is then polished to expose the tip portion of electrodes.

As another example, the method has been attracting attention recently, in that a semiconductor wafer substrate is provided thereon with semiconductor devices each having protruded electrodes called post electrodes which are formed so as the tips thereof be exposed, and that this semiconductor wafer substrate as-is can be subjected to resin sealing process without being cut into chips. In addition, the noted semiconductor devices are disclosed as chip-size package or wafer level chip-size package (Japanese Laid-Open Patent Application No. 2000-260910).

In the resin sealing process for fabricating the chip-size package, sealant resin layers can be formed by spin-coating raw resin layer or by heat molding under pressurization in a metal mold, for example. In the spin-coating method for forming the sealant resin layer, however, a drawback is that additional steps must be taken for forming a coating layer at the tip of the protruded electrode, as noted earlier, thereby complicating the process. In addition, other drawbacks are encountered in the method of spin coating such as wasteful use of resinous material and difficulty in precise control of raw sealant resin layer especially in the vicinity of protruded electrodes.

In the method using metal molds, disadvantages are that various kinds of molds have to be provided corresponding to each wafer substrate with different specification, and that polishing steps are required for exposing tip portions of electrodes, to thereby increase manufacturing costs.

Furthermore, there encountered a difficulty in handling the thus prepared sealant resin layer, in which chipping off of the resin layer may arise during dicing steps or conveying steps following the carving out of the semiconductor devices.

BRIEF SUMMARY OF THE INVENTION

Accordingly, it is an object of the present disclosure to provide an apparatus and a method for manufacturing semiconductor devices according to improved steps of forming a sealant resin layer with reduced costs, having most, if not all, of the advantages and features of similar employed device and methods, while eliminating many of their disadvantages.

It is another object of the present disclosure to provide an apparatus and a method for manufacturing semiconductor devices for forming a sealant resin layer on the surface of a wafer substrate such that at least the tip portions of protruded electrodes formed on the wafer substrate are exposed.

The following description is a synopsis of only selected features and attributes of the present disclosure. A more complete description thereof is found below in the section entitled "Description of the Preferred Embodiments."

An apparatus for manufacturing a semiconductor device disclosed herein preferably includes a substrate holding unit for holding a semiconductor wafer substrate provided at least with an electrode formed on a first surface thereof, a discharging mechanism for discharging droplets of raw sealant resin contained in a resin container unit through at least one discharging nozzle onto the first surface of semiconductor wafer substrate held on the substrate holding unit, a drive mechanism for displacing at least one of the semiconductor wafer substrate and discharging nozzle, and a control unit for controlling the discharging mechanism and drive mechanism such that the raw sealant resin is attached to the first surface of semiconductor wafer substrate except at least a portion of the electrode.

The apparatus may further include at least two kinds of discharging mechanisms each being capable of discharging raw sealant resin of the amount different from each other, and a heater for heating the raw sealant resin contained in the resin container unit.

In addition, the apparatus disclosed herein for manufacturing a semiconductor device is further characterized by the noted electrode formed on the surface of semiconductor wafer substrate being a protruded electrode, the control unit adapted to control the discharging mechanism and drive mechanism such that the raw sealant resin is attached to the surface except the tip portion of the protruded electrode, the discharging mechanism provided with a plurality of discharging nozzles, the substrate holding unit provided with a substrate temperature control mechanism for controlling temperature of at least the semiconductor wafer substrate, and the control unit is adapted to control the discharging mechanism and drive mechanism such that the raw sealant resin is not attached to at least a portion of dicing lines and forms a layer with edges of a rounded shape in the vicinity of intersecting points of the dicing lines.

According to another aspect, a method for manufacturing a semiconductor device is provided, including the step of resin sealing for sealing a semiconductor wafer substrate provided at least with a electrode formed on a first surface thereof, including at least one of, scanning a discharging nozzle for discharging droplets of raw sealant resin while suitably discharging the droplets, forming a layer of raw sealant resin on the first surface of semiconductor wafer substrate such that a portion of the electrode is excluded from the formation of the layer, and forming a sealant resin layer by hardening the layer of raw resin sealant.

The present method is further characterized by the additional step of forming the layer of raw sealant resin, including forming except the tip portion of the protruded electrode; forming by discharging droplets of raw sealant resin of the amount smaller for an area in the vicinity of the electrode than other portions of the semiconductor wafer substrate; forming except at least a portion of dicing lines; forming so as not to be attached to the dicing lines and to have a rounded shape in vicinity of intersecting points of the dicing lines; forming by discharging droplets of raw sealant resin of the amount suitably differentiated depending on the location on the surface of wafer substrate; and/or forming the layer of raw sealant resin, hardening the layer of raw sealant resin to form a first semi-hardened sealant resin layer, repeating at least once a further step of forming a further raw sealant resin layer and hardening the further raw sealant resin layer to form a further semi-hardened sealant resin layer, and hardening the first semi-hardened sealant resin layer and the further semi-hardened sealant resin layer altogether.

According to still another aspect, a semiconductor device is disclosed herein, including at least an electrode formed on the surface of a semiconductor wafer substrate, and a sealant resin layer formed on the surface of semiconductor wafer substrate such that a portion of the electrode is excluded from the formation of the sealant resin layer, in which edge portions of the sealant resin layer are formed with a rounded shape.

The semiconductor device disclosed herein is further characterized by protruded electrodes formed on the surface of semiconductor wafer substrate and the sealant resin layer formed except tip portions of the protruded electrodes.

The present disclosure and features and advantages thereof will be more readily apparent from the following detailed description and appended claims when taken with drawings.

BRIEF DESCRIPTION OF THE DRAWINGS

FIG. 4 is a schematic diagram illustrating overall construction of the apparatus for manufacturing the semiconductor devices according to another embodiment disclosed herein;

DETAILED DESCRIPTION OF THE INVENTION

Figure 1A:
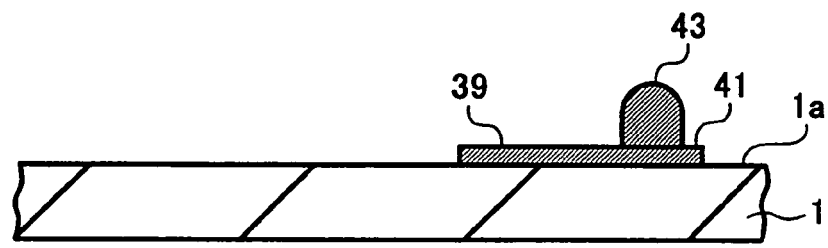
FIGS. 1A through 1C are each cross-sectional views illustrating the method for manufacturing semiconductor devices during various stages in the manufacturing process.

In the detailed description which follows, specific embodiments of the apparatus and method are described, which are particularly useful for forming a sealant resin layer on the surface of a semiconductor wafer substrate provided thereon with electrodes. It is understood, however, that the present disclosure is not limited to these embodiments. For example, the apparatus and method for the formation disclosed herein may also be adaptable to any form of layer formation. Other embodiments will be apparent to those skilled in the art upon reading the following description.

The apparatus disclosed herein for manufacturing a semiconductor device, as described earlier, includes a substrate holding unit for holding a semiconductor wafer substrate provided at least with an electrode formed on a first surface thereof, a discharging mechanism for discharging droplets of raw sealant resin contained in a resin container unit onto the first surface of semiconductor wafer substrate held on the substrate holding unit, a drive mechanism for displacing at least one of the semiconductor wafer substrate and discharging nozzle, and a control unit for controlling the discharging mechanism and drive mechanism such that the raw sealant resin is attached to the surface of semiconductor wafer substrate except at least a portion of the electrode.

In the case where protruded electrodes are formed on a first surface of the semiconductor wafer substrate, a layer of raw sealant resin is formed by discharging the resin such that the tip portion of the protruded electrode is excluded from the formation of the layer. Thereafter, the wafer substrate is removed from the substrate holding unit 3, subjected so as the raw sealant resin layer be formed on the surface of semiconductor wafer substrate.

As the raw sealant resin used herein, there exemplified are thermoplastic or thermosetting plastics and other similar materials.

By means of the apparatus disclosed herein, the raw sealant resin layer can be formed without several steps for exposing the tip portion of the protruded electrode such as forming a coating layer at the tip of the protruded electrode and polishing the tip portions, thereby facilitating for simplifying manufacturing process. In addition, since no metal mold is used, various kinds of semiconductor devices can be produced with one single apparatus. Still in addition, since wasteful use of resinous material can be reduced compared with the method for forming the sealant resin layer by spin coating method, manufacturing costs can be reduced with the present method.

Furthermore, since the amount of raw sealant resin can suitably be differentiated during discharging steps depending on the location on the surface of wafer substrate, more precise control of the thickness of sealant resin layer becomes feasible with the apparatus disclosed herein.

The method disclosed herein for manufacturing a semiconductor device, as described earlier, includes the step of resin sealing for sealing a semiconductor wafer substrate provided at least with a electrode formed on a first surface thereof, including at least one of scanning a discharging nozzle for discharging droplets of raw sealant resin while suitably discharging the droplets, forming a layer of raw sealant resin on the surface of semiconductor wafer substrate such that a portion of the electrode is excluded from the formation of the layer, and forming a sealant resin layer by hardening the layer of raw resin sealant.

By means of the method disclosed herein, the raw sealant resin layer can be formed without the steps for exposing the tip portion of the protruded electrode, thereby facilitating for simplifying manufacturing process. In addition, since no metal mold is necessary in this method, no mold has to be prepared. Still in addition, wasteful use of resinous material is alleviated compared with the method for forming the sealant resin layer by spin coating method. As a result, manufacturing costs can be reduced.

Furthermore, since the amount of raw sealant resin can suitably be controlled depending on the location on the surface of wafer substrate, more precise control of the thickness of sealant resin layer becomes feasible.

In the case where the present method is applied to the wafer substrate provided with pad electrodes, the sealant resin layer 83 is formed having openings at least above the pad electrodes. Since this enables to eliminate etching process steps, the number of steps can be reduced, thereby facilitating for reducing manufacturing costs.

The semiconductor device disclosed herein, as described earlier, includes an electrode formed on the surface of a semiconductor wafer substrate, and a sealant resin layer formed on the surface of semiconductor wafer substrate such that a portion of the electrode is excepted from the formation of the sealant resin layer, in which edge portions of the sealant resin layer are formed with a rounded shape.

In the thus formed semiconductor devices, rounded corners are formed at four corners and upper edge portions of the sealant resin layer, chipping off of the resin layer can be alleviated during dicing and conveying steps following the carving out of the semiconductor devices.

The present disclosure will be described in more detail below by way of examples.

Figure 1B:
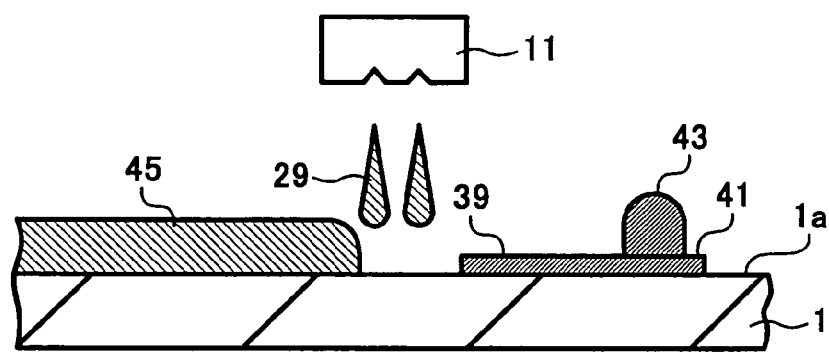
Figure 1C:
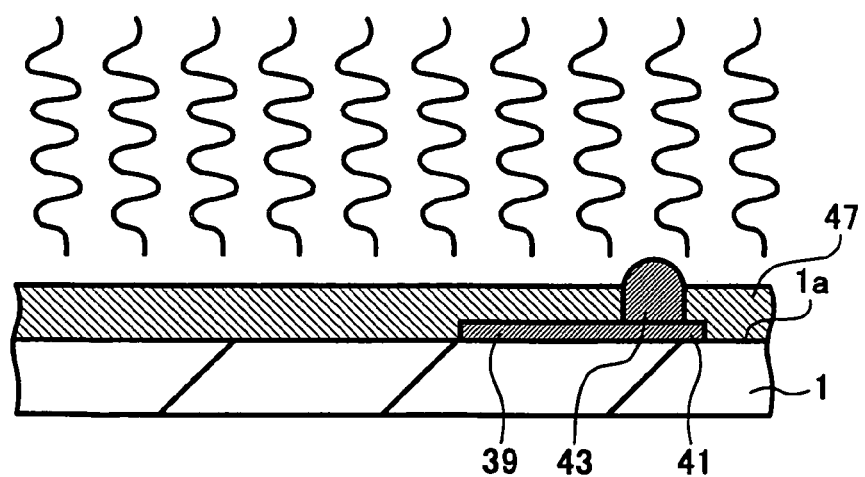
Figure 2:
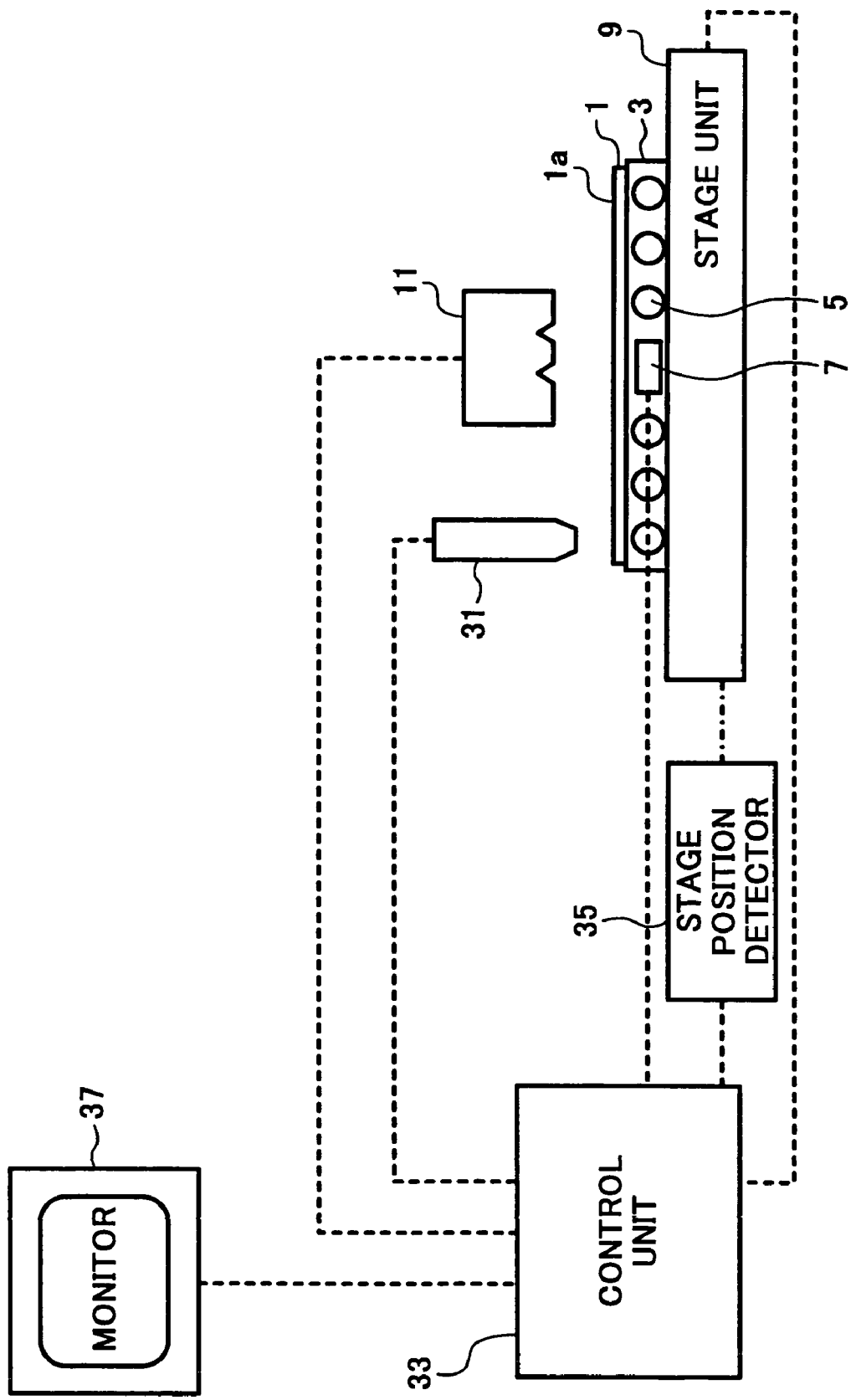
FIG. 2 is a schematic diagram illustrating overall construction of the apparatus for manufacturing the semiconductor devices.

FIGS. 1A through 1C are each cross-sectional views illustrating the method for manufacturing semiconductor devices during various stages in the manufacturing process. FIG. 2 is a schematic diagram illustrating overall construction of the apparatus for manufacturing the semiconductor devices.

Referring now to FIG. 2, the apparatus will be described according to one embodiment disclosed herein. The apparatus for manufacturing the semiconductor devices includes at least a semiconductor wafer substrate 1 and a substrate holding unit 3. The semiconductor wafer substrate 1 is provided with several bumped electrodes (not shown) each having a protruded shape on a first surface 1a thereof.

The substrate holding unit 3 is provided for holding the wafer substrate 1 with its first surface 1a up. On top face of the substrate holding unit 3 there provided are small openings (not shown) in use for holding substrate 1 with vacuum with the first surface 1a up, and the openings, in turn, are each connected to a vacuum unit (not shown) by way of evacuation paths. The substrate holding unit 3 is thereby formed to be capable of properly holding the semiconductor wafer substrate 1.

In addition, the substrate holding unit 3 is further provided with a heater 5 for heating the wafer substrate 1 and a temperature sensor 7 for measuring the temperature of the holding unit 3. The heater 5 and temperature sensor 7 then constitute a substrate temperature control mechanism in the apparatus for manufacturing the semiconductor devices disclosed herein.

Further provided is a stage unit 9 in use for positioning the substrate holding unit 3. The stage unit 9 is adapted for either displacing the substrate holding unit 3 in horizontal and/or vertical directions, or rotating on the horizontal plane. The unit 3 therefore constitutes a drive mechanism in the apparatus for manufacturing the semiconductor devices disclosed herein.

There provided are a discharging head 11 above the stage unit 9 adapted for discharging raw (uncured) sealant resin and an image information camera 31 for acquiring the images of semiconductor wafer substrate 1. The discharging head 11 therefore constitutes a discharging mechanism in the apparatus for manufacturing the semiconductor devices disclosed herein. It may be added that the position of the discharging head 11 and image information camera 31 are fixed respectively according to the present embodiment.

Figure 3A:
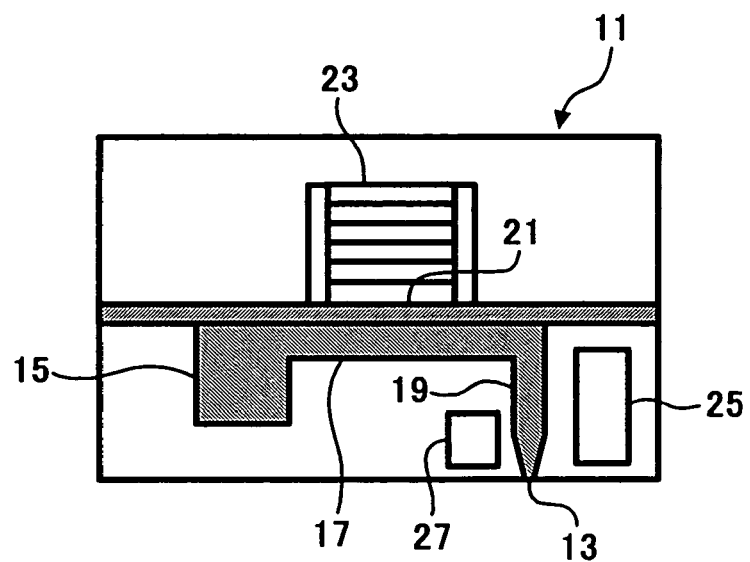
FIGS. 3A and 3B are cross sectional views illustrating the overall construction of the discharging head 11 in its standby and operation periods, respectively.
Figure 3B:
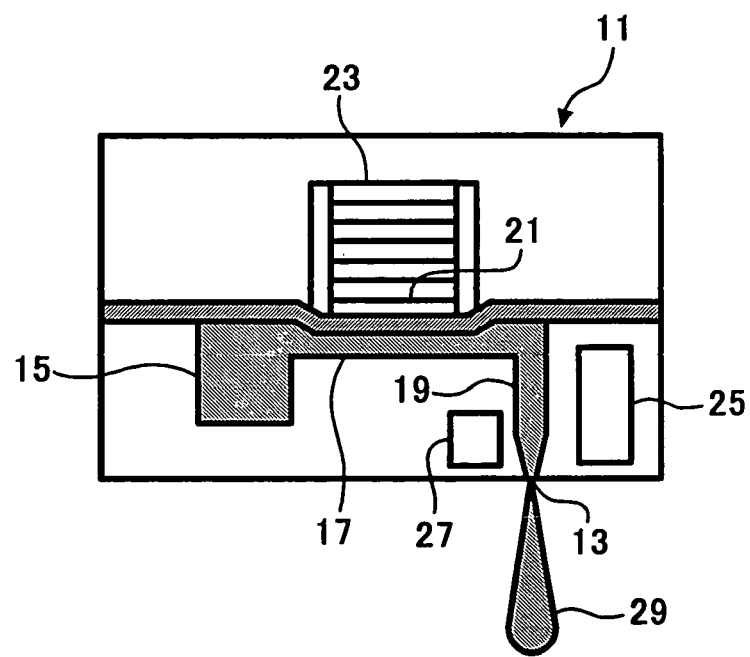

FIGS. 3A and 3B are cross sectional views illustrating the overall construction of the discharging head 11 in its standby and operation periods, respectively. A plurality of discharging nozzles 13 are formed, being aligned either in line or in array, on the face of the discharging head 11 opposing to the semiconductor wafer substrate 1.

There shown for purposes of explanation, respectively, are two and one discharging nozzles 13 for the discharging head of FIGS. 2 and 3. In addition, a resin container unit 15 is provided for each of the discharging nozzles 13 for containing the raw sealant resin. The resin container unit 15 is connected to the discharging nozzles 13 by way of a fluid feeding path 17 and a discharging vessel 19. A portion of the wall of fluid feeding path 17 is formed of a thin flexible film 21. On one side of the thin flexible film 21 opposite to the fluid feeding path 17, a piezoelectric element 23 is also provided. In addition, the discharging head 11 is provided with a heater 25 for heating, and a temperature sensor 27 for measuring the temperature of, the raw sealant resin.

The thus formed discharging head 11 is operated as follows. The discharging head 11 is adapted for discharging liquid droplets 29 of raw sealant resin by exerting pressure generated by the deformation of the piezoelectric element 23.

For example, the piezoelectric element 23 is elongated by applying a voltage and the fluid feeding path 17 is then pressurized. As a result, a predetermined amount of sealant resin is discharged through the discharging nozzles 13 by the pressure presently applied (FIG. 3B). When the piezoelectric element 23 returns to the previous state, another amount of raw sealant resin is drawn by suction from the resin container unit 15 into fluid feeding path 17 (FIG. 3A). The amount of raw sealant resin discharged through the discharging head 11 is adjusted to approximately 0.05 nanoliter, for example.

The discharging head 11 disclosed herein according to the present embodiment, therefore, has the structure similar to the piezoelectric type (or piezo-jet type) printer head for use in ink jet printers.

Referring again to FIG. 2, a control unit 33 is additionally provided which is electrically connected to, and adapted for controlling, the stage unit 9 and discharging head 11. A stage position detector 35 is provided in the vicinity of the stage unit 9 for acquiring information on the position of this stage unit 9. To the control unit 33 there electrically connected are the temperature sensor 7, image information camera 31, and stage position detector 35, as well.

Several pieces of information such as temperature information from temperature sensors 7, 27, image information from the image information camera 31, and stage position information from the stage position detector 35, are transmitted to the control unit 33. Furthermore, a monitor 37 is also electrically connected to the control unit 33 for displaying setting information, for example.

Referring now to FIGS. 1A through 2, the method for manufacturing semiconductor devices will be described according to one embodiment disclosed herein together with the description on the operation of the manufacturing apparatus. It may be noted that only one of the discharging nozzles 13 is included in the apparatus of FIGS. 1A through 1C and other portions are herein abbreviated.

In addition, as the raw sealant resin which is generally exemplified by thermoplastic or thermosetting plastics and other similar materials, there selected in the present embodiment is a thermosetting resin, liquid epoxy sealant resin CEL-C-3140 (commercially available from Hitachi Chemical Co.) with viscosity of 0.6 Pa·s. (1) A semiconductor wafer substrate 1 is provided thereon with a metallized wiring layer 39 and a pad electrode 41, which are each formed on a first surface 1a of the substrate 1. A bump electrode 43 is additionally formed on top of the pad electrode 41.

The thus prepared entire structure of the semiconductor wafer substrate 1 is subsequently placed on a substrate holding unit 3 with the first surface 1a up. The bump electrode 43 is formed of solder, for example, having a height of 20 μm from the first surface 1a (FIG. 1A).

The substrate holding unit 3 then operates to hold with vacuum the semiconductor wafer substrate 1. Also for the semiconductor wafer substrate 1, surface treatment steps to improve the wettability with the raw sealant resin may be carried out on the face of the first surface 1a, metallized wiring layer 39, pad electrode 41, and/or bump electrode 43.

Alternatively, the semiconductor wafer substrate 1 may be coated with a thin layer of materials which can yield suitable wettability. Suitable examples of the surface treatment for also yielding the wettability include one utilizing active species, which are generated from gaseous ozone or plasma and brought in contact with the surface. The surface treatment, however, may not always be necessary, but be utilized when necessary.

(2) The control unit 33 is adapted for controlling the heating by means of the heater 25 based on temperature information from the temperature sensor 27, to thereby properly control the temperatures of raw sealant resin at the locations in the resin container unit 15, fluid feeding path 17, and discharging vessel 19, in the discharging head 11.

In addition, the control unit 33 also controls the heating by the heater 5 based on temperature information from the temperature sensor 7, to thereby properly control the temperature of the surface 1a of wafer substrate 1.

The positioning steps for the semiconductor wafer substrate 1 held on the substrate holding unit 3 are carried out by means of the control unit 33 by properly displacing the stage unit 9 based on image information from image information camera 31.

During the positioning process the control unit 33 is adapted for calculating, based on image information on wafer substrate 1 from image information camera 31, the area of the semiconductor wafer substrate 1, onto which raw sealant resin is to be discharged except the area for the bump electrode 43.

Subsequently followed are several steps such as sending driving signals to the stage unit 9 and discharging head 11 based on the comparison with the stage position information from stage position detector 35, positioning the substrate holding unit 3 with the suction held semiconductor wafer substrate 1, suitably discharging liquid droplets 29 of raw sealant resin from discharging head 11, and forming thereby a raw sealant resin layer 45 on the surface 1a of the wafer substrate 1 including metallized wiring layer 39 and pad electrode 41.

It should be added, the steps of discharging during the process are carried out such that no liquid droplet 29 of raw sealant resin from discharging head 11 is discharged onto the area of the bump electrode 43. The raw sealant resin layer 45 is formed in the present embodiment to a thickness of 20 μm, for example (FIG. 1B).

Since the volume of the droplet of raw sealant resin discharged by the discharging head 11 can be controlled with a precision as much as 5 nanoliter, the resin amount of the droplets 29 can also be controlled to such an extent that the separation between the bump electrode 43 and the resin layer is suitably achieved with a precision of several microns, for example.

(3) Following the formation of raw sealant resin layer 45 on the surface 1a of the wafer substrate 1 except the area of the bump electrode 43, the wafer substrate 1 is removed from the substrate holding unit 3.

The wafer substrate 1 is subsequently subjected to heat treatments, first at 120° C. for 30 min and then at 150° C. for 120 min, for thermosetting the raw sealant resin layer 45, whereby a sealant resin layer 47 is formed having a thickness of about 20 μm (FIG. 1C).

The process steps described above for forming the sealant resin layer 47 on the surface 1a of the wafer substrate 1 (resin encapsulation steps) are carried out such that the top portion of the bump electrode 43 is uncovered of the resin layer. The steps otherwise necessitated for removing resin portions on the bump electrode can therefore be eliminated. The present method can thus facilitate to simplify manufacturing process steps.

In addition, since this eliminates the use of metal mold for the resin capsulation, various kinds of semiconductor device products can be handled with one single manufacturing apparatus disclosed herein. Further, wasteful use of resinous material can be reduced compared with the method of spin coating. As a result, manufacturing costs can be reduced with the present method.

Still in addition, the amount of the resinous material to be discharged onto the surface 1a of the wafer substrate 1 can suitably controlled depending on the portion thereof specifically, the precise control of the thickness of the sealant resin layer 47 can be achieved with more ease.

FIG. 4 is a schematic diagram illustrating overall construction of the apparatus for manufacturing the semiconductor devices according to another embodiment disclosed herein, in which components similar to those in FIG. 2 are shown with identical numerical representations and detailed description thereof is herein abbreviated.

A further discharging head 49 is provided above the stage unit 9 for discharging raw sealant resin of the amount different from the discharging head 11. The position of the discharging head 49 is herein fixed. In addition, the discharging head 49 is formed having a similar structure to the head 11 and adapted for discharging droplets of raw sealant resin adjusted to approximately 100 nanoliter, for example. The control unit 33 is then adapted to control the operation of the discharging head 49, as well.

Figure 5A:
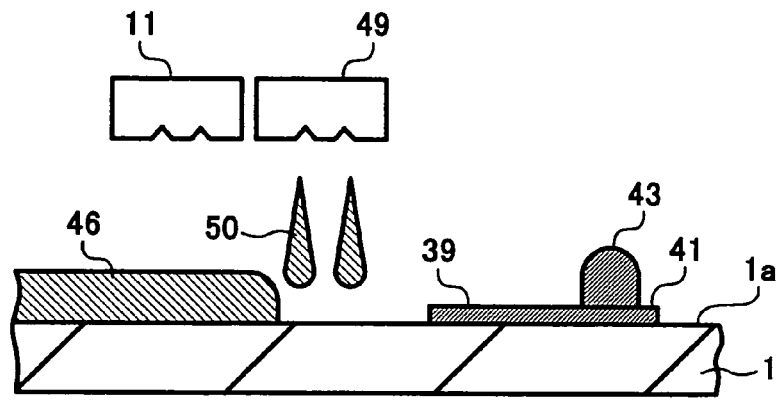
FIGS. 5A through 5C are each cross-sectional views illustrating the method for manufacturing semiconductor devices during various stages in the process according to another embodiment disclosed herein.
Figure 5B:
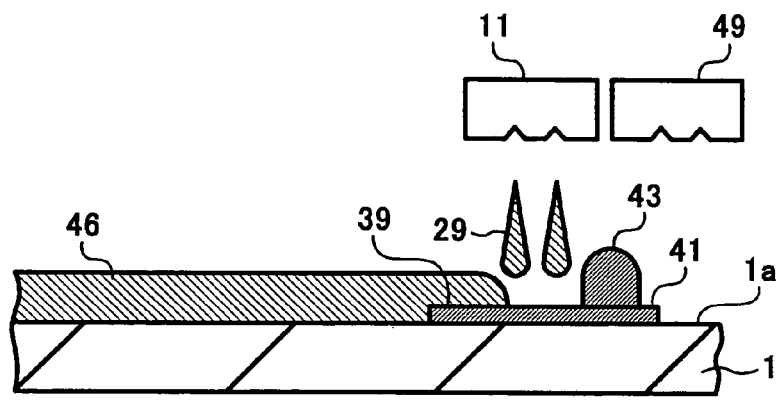
Figure 5C:
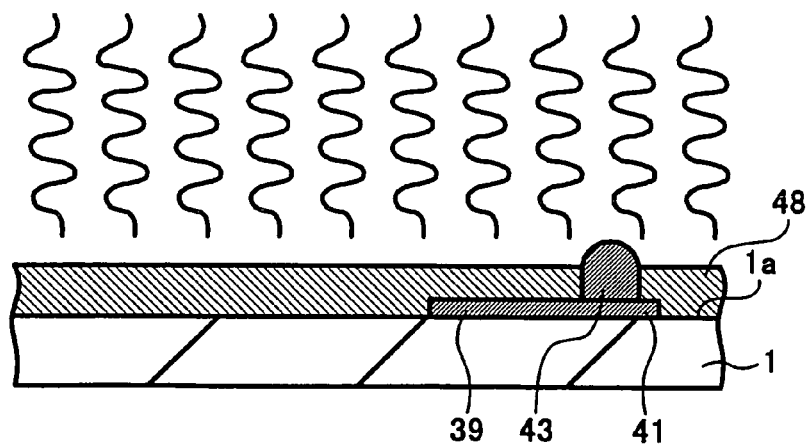

FIGS. 5A through 5C are each cross-sectional views illustrating the method for manufacturing semiconductor devices during various stages in the process according to another embodiment disclosed herein.

The apparatus shown in FIG. 4 is utilized also in the present embodiment as the apparatus for manufacturing the semiconductor devices. It may be noted that two discharging nozzles 13 are shown in the apparatus of FIGS. 5A through 5C and other portions are herein abbreviated.

Referring now to FIGS. 4 through 5C, the method for manufacturing semiconductor devices will be described together with the description on the operation of the manufacturing apparatus.

(1) A semiconductor wafer substrate 1 is provided thereon with a metallized wiring layer 39 and a pad electrode 41, which are each formed on a first surface 1a of the substrate 1. A bump electrode 43 is additionally formed on top of the pad electrode 41. The thus prepared entire structure of the semiconductor wafer substrate 1 is subsequently placed on a substrate holding unit 3 with the first surface 1a up. The control unit 33 then calculates the area of the semiconductor wafer substrate 1, onto which sealant resin is to be discharged.

Thereafter, the control unit 33 operates to control the movements of the discharging heads 11, 49 and the stage unit 9, so as to initiate discharging the raw sealant resin onto the surface 1a of the wafer substrate 1. For the surface area except in the vicinity of the bump electrode 43, a raw sealant resin layer is formed using the discharging head 49 having the capability of discharging liquid droplets 50 of the above noted larger amount. As a result, the throughput for device manufacturing can be improved comparing with the case where the raw sealant resin layer is formed using the discharging head 46 with liquid droplets 50 of a smaller amount (FIG. 5A).

(2) On the surface area in the vicinity of the bump electrode 43 as close equal to, or less than 5 μm, for example, another raw sealant resin layer is formed using the discharging head 11 having the capability of discharging liquid droplets 29 of a smaller amount. As a result, the resin amount can be controlled to such an extent that the separation between the bump electrode 43 and resin layer is suitably achieved with proper precision (FIG. 5B).

(3) Following the formation of the raw sealant resin layer 45 on the surface 1a of the wafer substrate 1 except the area of the bump electrode 43, the wafer substrate 1 is removed from the substrate holding unit 3. The wafer substrate 1 is subsequently subjected to heat treatments, first at 120° C. for 30 min and then at 150° C. for 120 min, for thermosetting the raw sealant resin layer 46, whereby a further sealant resin layer 48 is formed having a thickness of about 20 μm (FIG. 5C).

Figure 6A:
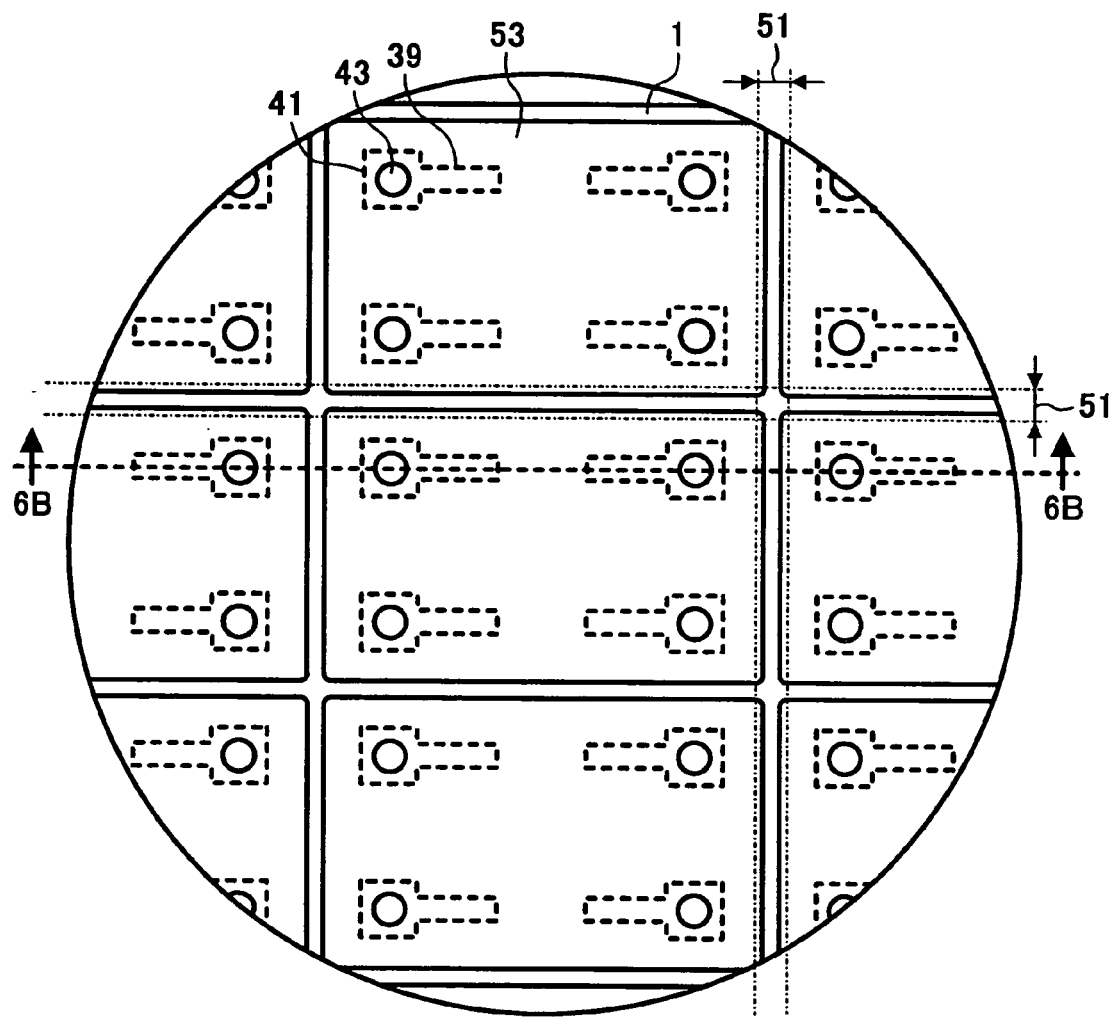
FIG. 6A is a top view of a portion of a semiconductor wafer substrate 1 after forming a sealant resin layer according to still another embodiment disclosed herein.
Figure 6B:
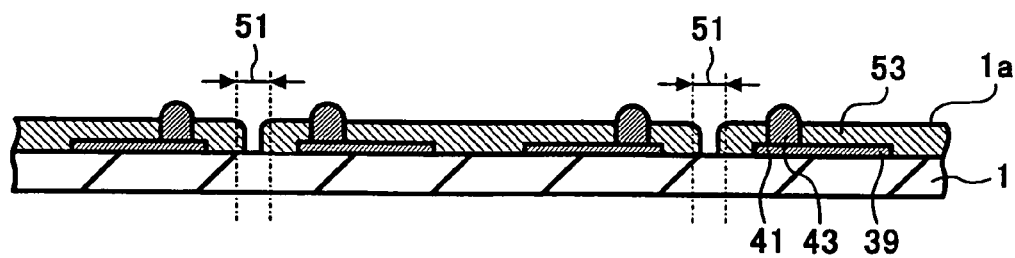
FIG. 6B is a cross-sectional view taken along the line 6B-6B of the structure of FIG. 6A.

FIGS. 6A and 6B are prepared to illustrate the method for manufacturing semiconductor devices according to still another embodiment disclosed herein, in which FIG. 6A is a top view of a portion of a semiconductor wafer substrate 1 after forming a sealant resin layer and FIG. 6B is a cross-sectional view taken along the line 6B-6B of the structure of FIG. 6A.

The apparatus shown in FIG. 2 is utilized also in the present embodiment as the apparatus for manufacturing the semiconductor devices. Referring now to FIGS. 2, 6A and 6B, the method for manufacturing semiconductor devices will be described together with the description on the operation of the manufacturing apparatus.

(1) In a manner similar to that described earlier referring to FIG. 1, a semiconductor wafer substrate 1 is placed on a substrate holding unit 3 with the first surface 1a up; the temperatures of raw sealant resin at the locations in the resin container unit 15, fluid feeding path 17, and discharging vessel 19, in the discharging head 11 are controlled through the control of the heater 25 by means of control unit 33; and the temperature of the surface 1a of wafer substrate 1 is properly controlled through the control of heater 5 by means of also control unit 33.

(2) The positioning steps for the semiconductor wafer substrate 1 held on the substrate holding unit 3 are carried out by means of the control unit 33 by properly displacing the stage unit 9. During the positioning process the control unit 33 is adapted for calculating, based on image information on wafer substrate 1 from image information camera 31 utilizing image recognition techniques, the area of the semiconductor wafer substrate 1, onto which raw sealant resin is to be discharged except the areas for forming the bump electrode 43 and for center portions of dicing lines.

Subsequently followed are several steps such as sending driving signals to the stage unit 9 and discharging head 11 based on the comparison with the stage position information from stage position detector 35, positioning the substrate holding unit 3 with the suction held semiconductor wafer substrate 1, suitably discharging minute liquid droplets of raw sealant resin from discharging head 11, and forming thereby a raw sealant resin layer on the surface 1a of the wafer substrate 1 including metallized wiring layer 39 and pad electrode 41.

It should be added, the noted steps of discharging are carried out such that no liquid droplet of raw sealant resin from discharging head 11 is attached to the area for forming the bump electrode 43 and center portions of dicing lines 51. The raw sealant resin layer is formed in the present embodiment to a thickness of 20 μm, for example.

(3) Following the formation of raw sealant resin layer on the surface 1a of the wafer substrate 1 except the area of the bump electrode 43 and center portions of dicing lines 51, the wafer substrate 1 is removed from the substrate holding unit 3. The wafer substrate 1 is subsequently subjected to heat treatments, first at 120° C. for 30 min and then at 150° C. for 120 min, for thermosetting the raw sealant resin layer 45, whereby a sealant resin layer 47 is formed having a thickness of about 20 μm.

According to the process steps described above referring to FIGS. 6A and 6B, the sealant resin layer is formed on the surface 1a of the wafer substrate 1 except the top portion of the bump electrode 43 and center portions of dicing lines 51. The present method can therefore facilitate also to simplify manufacturing process steps in a manner similar to the embodiment described earlier referring to FIG. 1, reducing manufacturing costs and achieving precise control of the thickness of the sealant resin layer with more ease.

In addition, since center portions of dicing lines 51 are uncovered by the sealant resin layer 53 as indicated above, the warping of the wafer substrate 1, which may be caused by stress, can be alleviated. Still in addition, although the sealant resin layer 53 is formed on the center portions of dicing lines 51 with partially overlapped portions, as described above, it is not intended to be limiting to the present disclosure. For example, the sealant resin layer 53 may alternatively be formed over the entire area of the dicing lines 51.

Furthermore, although the apparatus shown in FIG. 2 is utilized above, the apparatus of FIG. 4 may alternatively be used for manufacturing the semiconductor devices.

Figure 7A:
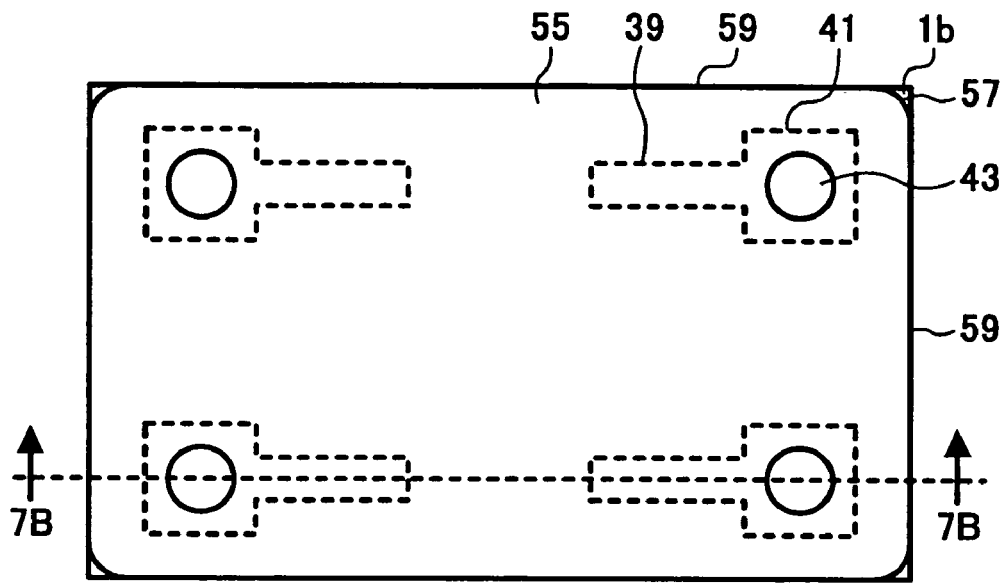
FIG. 7A is a top view of a portion of a semiconductor wafer substrate 1b according to another embodiment disclosed herein.
Figure 7B:
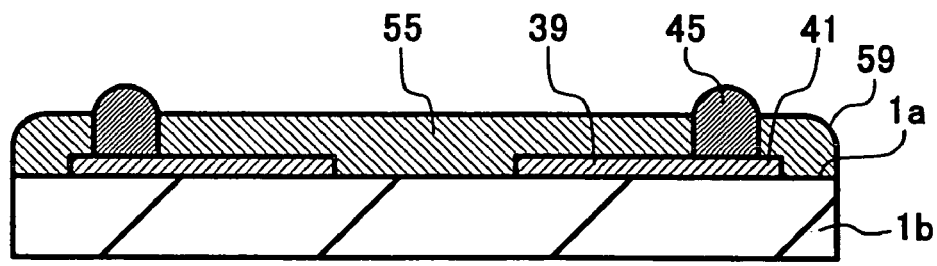
FIG. 7B is a cross-sectional view taken along the line 7B-7B of the structure of FIG. 7A.

FIGS. 7A and 7B are prepared to illustrate the method for manufacturing semiconductor devices according to another embodiment disclosed herein, in which FIG. 7A is a top view of a portion of a semiconductor wafer substrate 1b and FIG. 7B is a cross-sectional view taken along the line 7B-7B of the structure of FIG. 7A. A semiconductor wafer substrate 1b is provided thereon with a metallized wiring layer 39 and a pad electrode 41, which are each formed on a first surface 1a of the substrate 1b, and a bump electrode 43 formed on top of the pad electrode 41.

A sealant resin layer 55 is subsequently formed on the surface 1a of the wafer substrate 1 including metallized wiring layer 39 and pad electrode 41 to such a thickness as to expose the top portion of the bump electrode 43.

In addition, four corners 57 of the wafer substrate 1b are each provided with rounded corners (FIG. 7A). Furthermore, upper edge portions 59 of the sealant resin layer 55 are also provided with rounded corners as viewed along the extension of the side lines of the upper edge portions (FIG. 7B).

The thus formed round corners 57 of the sealant resin layer 55 facilitates the reduction of possible chipping off of the resin layer 55, which is caused during dicing the semiconductor wafers and conveying semiconductor devices.

In addition, since dicing blades do not come into contact with the upper edge portions 59 of the sealant resin layer 55 during dicing process, chipping off of the resin layer 55 can also be alleviated.

Furthermore, because of the above noted round corners formed on the upper edge portions 59 of the sealant resin layer 55, chipping off of the resin layer 55 at the edge portions 59 can also be reduced during conveyance following the dicing of the semiconductor devices.

Figure 8A:
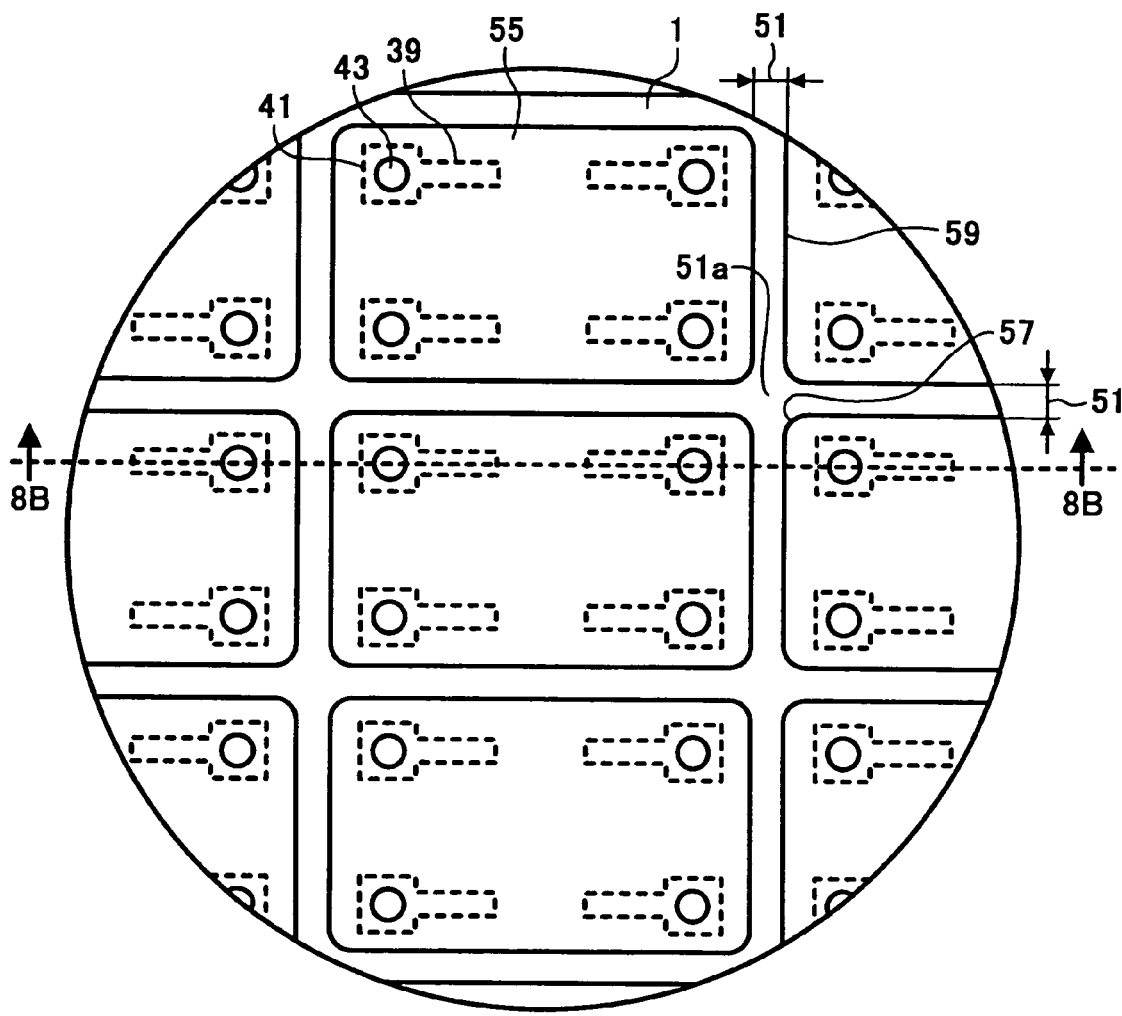
FIG. 8A is a top view of a portion of a semiconductor wafer substrate 1 after forming a sealant resin layer according to another embodiment disclosed herein.
Figure 8B:
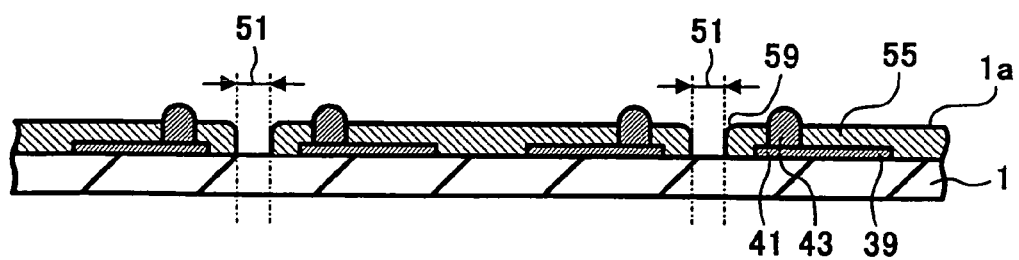
FIG. 8B is a cross-sectional view taken along the line 8B-8B of the structure of FIG. 8A.

FIGS. 8A and 8B are prepared to illustrate the method for manufacturing semiconductor devices according to another embodiment disclosed herein, in which FIG. 8A is a top view of a portion of a semiconductor wafer substrate 1 after forming a sealant resin layer and FIG. 8B is a cross-sectional view taken along the line 8B-8B of the structure of FIG. 8A.

The presently disclosed method is related to the production of semiconductor devices of FIGS. 7A and 7B. The apparatus shown in FIG. 2 is utilized also in the present embodiment as the apparatus for manufacturing the semiconductor devices.

Referring now to FIGS. 2, 8A and 8B, the method for manufacturing semiconductor devices will be described together with the description on the operation of the manufacturing apparatus.

(1) In a manner similar to that described earlier referring to FIG. 1, a semiconductor wafer substrate 1 is placed on a substrate holding unit 3 with the first surface 1a up; the temperatures of raw sealant resin at the locations in the resin container unit 15, fluid feeding path 17, and discharging vessel 19, in the discharging head 11 are controlled through the control of the heater 25 by means of control unit 33; and the temperature of the surface 1a of wafer substrate 1 is properly controlled through the control of heater 5 by means of also control unit 33.

(2) The positioning steps for the semiconductor wafer substrate 1 held on the substrate holding unit 3 are carried out by means of the control unit 33 by properly displacing the stage unit 9. During the positioning process the control unit 33 is adapted for calculating, based on image information on wafer substrate 1 from image information camera 31 utilizing image recognition techniques, the area of the semiconductor wafer substrate 1, onto which raw sealant resin is to be discharged except several areas such as for forming the bump electrode 43, for all dicing lines 51, and in the vicinity of intersecting points of the dicing lines.

There followed are several process steps such as sending driving signals to the stage unit 9 and discharging head 11 based on the comparison with the stage position information from stage position detector 35, positioning the substrate holding unit 3 with the suction held semiconductor wafer substrate 1, suitably discharging minute liquid droplets of raw sealant resin from discharging head 11, and forming thereby a raw sealant resin layer on the surface 1a of the wafer substrate 1 including metallized wiring layer 39 and pad electrode 41.

It should be added, the noted steps of discharging are carried out such that no liquid droplet of raw sealant resin from discharging head 11 is attached to the area for forming the bump electrode 43, for all dicing lines 51, and in the vicinity of intersecting points of the dicing lines, and that the boundary lines of presently discharged raw sealant resin on the wafer substrate are formed each having rounded shapes at respective corner portions. The raw sealant resin layer is formed in the present embodiment to a thickness of 20 μm, for example.

(3) Following the formation of raw sealant resin layer on the surface 1a of the wafer substrate 1 except the areas of the bump electrode 43, all dicing lines 51 and the vicinity of intersecting points of the dicing lines, such as for forming the bump electrode 43, for all dicing lines 51, the wafer substrate 1 is removed from the substrate holding unit 3.

The wafer substrate 1 is subsequently subjected to heat treatments, first at 120° C. for 30 min and then at 150° C. for 120 min, for thermosetting the raw sealant resin layer 45, whereby a sealant resin layer 55 is formed having a thickness of about 20 μm.

According to the present method, therefore, four corners 57 of the wafer substrate 1b are each provided with rounded corners, and upper edge portions 59 of the sealant resin layer 55 are provided with also rounded corners as viewed along the extension of the side lines of the upper edge portions.

As shown in FIGS. 8A and 8B, a sealant resin layer 55 is thus formed on the surface 1a of the wafer substrate 1 except the areas of the bump electrode 43, all dicing lines 51 and the vicinity of intersecting points of the dicing lines.

The present method can therefore facilitate also to simplify manufacturing process steps in a manner similar to the embodiment described earlier referring to FIG. 1, reducing manufacturing costs and achieving precise control of the thickness of the sealant resin layer with more ease.

In addition, since center portions of dicing lines 51 and the vicinity of intersecting points of the dicing lines are uncovered by the sealant resin layer 53, the warping of the wafer substrate 1, which may be caused by stress, can be alleviated.

(4) The wafer substrate 1 provided thereon with sealant resin layer 55 is subsequently diced along dicing lines 51, whereby semiconductor devices are carved out (dicing process).

Since the dicing lines 51 are uncovered by the sealant resin layer 55, chipping off, which is possibly caused at the four corners 57 of the region for forming the sealant resin layer 55 corresponding to intersecting points 51a of the dicing lines 51 and the upper edge portions 59, can be reduced during dicing process.

Furthermore, since rounded corners are formed at four corners 57 and at the upper edge portions 59 of the sealant resin layer 55 as viewed along the extension of the side lines of the upper edge portions (FIG. 7B), chipping off of the resin layer can also be reduced during conveyance following the carving out of the semiconductor devices.

Although the sealant resin layer 53 is formed in the present embodiment, rounded portions are formed at the four corners 57 of the region for forming the sealant resin layer 55 corresponding to intersecting points 51a of the dicing lines 51, it is not intended to be limiting to the present disclosure.

For example, rounded portions may not be intended to be formed at the four corners 57 of the region for forming the sealant resin layer 55 corresponding to intersecting points, and a sealant resin layer may not be formed on the dicing lines either.

In this case, since rounded portions can be formed at four corners of the region for forming the sealant resin layer and the upper edge portions 59 through surface tension of raw sealant resin, chipping off of the resin layer can also be reduced during conveyance following the carving out of the semiconductor devices. Furthermore, since the dicing lines are uncovered with the sealant resin layer, chipping off during dicing process of the resin layer can be alleviated. Still further, although the apparatus shown in FIG. 2 is utilized above, the apparatus of FIG. 4 may alternatively be used for manufacturing the semiconductor devices.

FIGS. 9A through 9D are each cross-sectional views illustrating the method for manufacturing semiconductor devices during various stages in the process according to another embodiment disclosed herein. The apparatus shown in FIG. 4 is utilized also in the present embodiment as the apparatus for manufacturing the semiconductor devices. It may be noted that a discharging nozzles 11 is shown in the apparatus of FIGS. 9A through 9D and other portions are herein abbreviated.

Referring now to FIGS. 2, 9A through 9D, the method for manufacturing semiconductor devices will be described together with the description on the operation of the manufacturing apparatus.

(1) A semiconductor wafer substrate 1 is provided thereon with a metallized wiring layer 39 and a pad electrode 41, which are each formed on a first surface 1a of the substrate 1. A bump electrode 61 is additionally formed on top of the pad electrode 41. The thus prepared entire structure of the semiconductor wafer substrate 1 is subsequently placed on a substrate holding unit 3 with the first surface 1a up. The bump electrode 61 is formed of solder, for example, having a height of 20 μm from the first surface 1a.

Figure 9A:
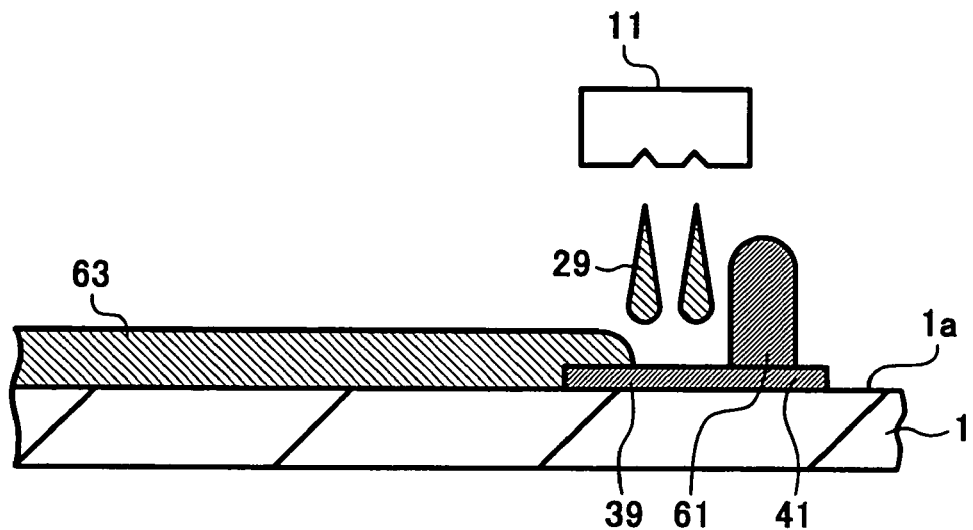
FIGS. 9A through 9D are each cross-sectional views illustrating the method for manufacturing semiconductor devices during various stages in the process according to another embodiment disclosed herein.

Following the calculation by the control unit 33, of the area of the semiconductor wafer substrate 1, onto which sealant resin is to be discharged, the movements of the stage unit 9 and discharging heads 11 are controlled, the discharge of raw sealant resin is initiated onto the surface 1a of the wafer substrate 1, whereby a raw sealant resin layer 63 having a thickness of approximately 20 μm is formed on the surface 1a of the wafer substrate 1 except the area for forming the bump electrode 61 (FIG. 9A).

Figure 9B:
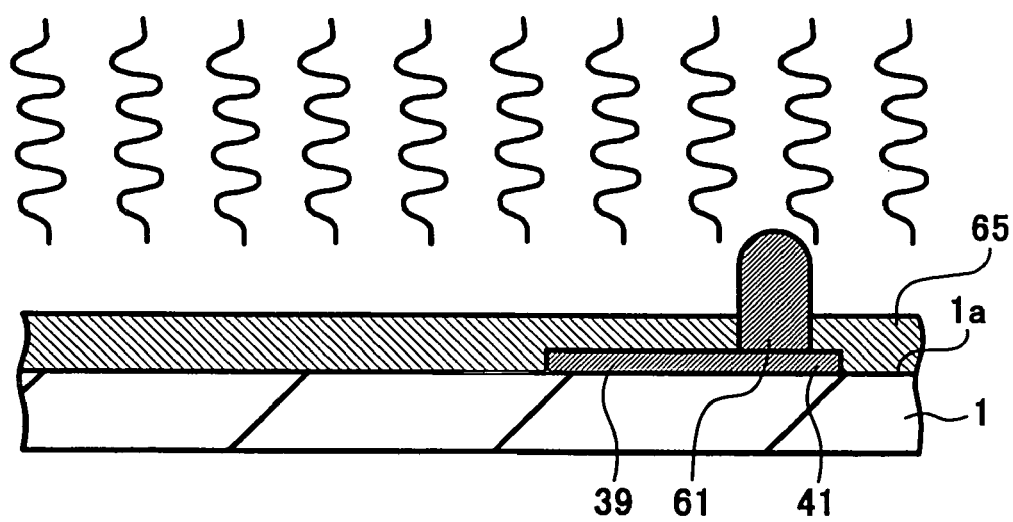

(2) Following the formation of the raw sealant resin layer 45 on the surface 1a of the wafer substrate 1 except the area for forming the bump electrode 61, the wafer substrate 1 is subjected to heat treatment at 90° C. for 30 min to form a semi-hardened layer, whereby a semi-hardened sealant resin layer 65 is formed (FIG. 9B). The heat treatment may be carried out by either the heater 5 previously provided in the substrate holding unit 3 or other heating devices after removing the wafer substrate 1 from the substrate holding unit 3.

Figure 9C:
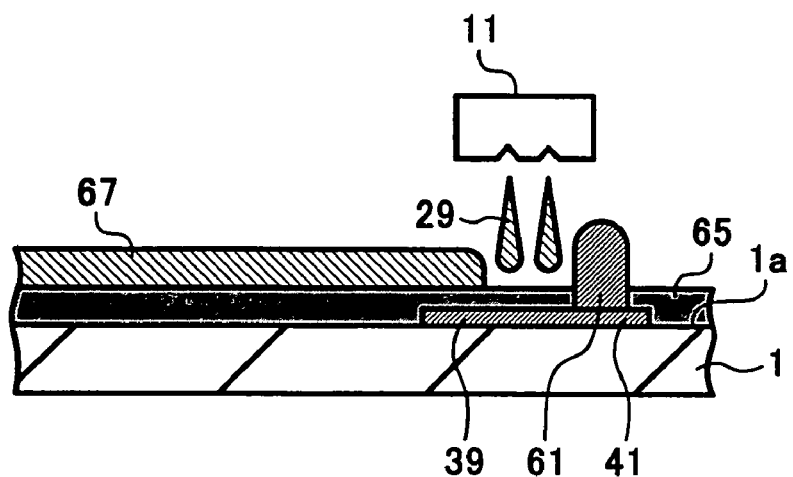

(3) Subsequently, by controlling the movements of the stage unit 9 and discharging heads 11, another raw sealant resin layer 67 is formed to a thickness of approximately 20 μm, for example, on top of the semi-hardened sealant resin layer 65 (FIG. 9C).

Figure 9D:
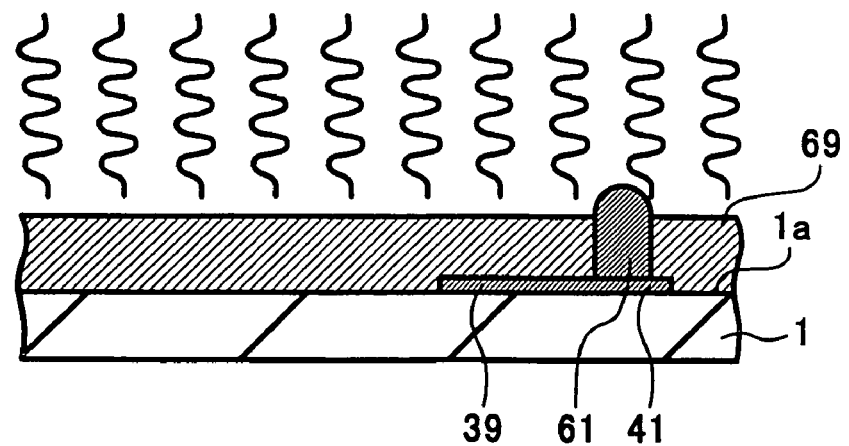

(4) Following the formation of the raw sealant resin layer 67 on top of the semi-hardened sealant resin layer 65, the wafer substrate 1 is removed from the substrate holding unit 3. The wafer substrate 1 is subsequently subjected to heat treatments, first at 120° C. for 30 min and then at 150° C. for 120 min, for thermosetting the semi-hardened sealant resin layer 65 and raw sealant resin layer 47, whereby a further sealant resin layer 69 is formed having a thickness of about 20 μm, for example (FIG. 9D).

As disclosed above, after forming the semi-hardening the raw sealant resin layer 63, that is carried out by first discharging a raw sealant resin layer 63 onto the surface 1a of the wafer substrate 1 and then forming semi-hardened sealant resin layer 65 by semi-hardening the raw sealant resin layer 63, by then forming thereon a further raw sealant resin layer 47, the sealant resin layer 69 can be formed with an increased thickness.

Although the step of forming additional raw sealant resin layer 47, which follows the step of semi-hardening the raw sealant resin layer, is carried out only once in the present embodiment, it is not intended to be limiting.

For example, the step of forming additional raw sealant resin layer may be repeated more than once so as to achieve a suitable thickness of the sealant resin layer. In addition, although the apparatus shown in FIG. 2 is utilized above, the apparatus of FIG. 4 may alternatively be used for manufacturing the semiconductor devices.

Although the raw sealant resin layer 69 is formed on the entire upper surface area of wafer substrate 1 except the area for forming the bump electrode 61 in the present embodiment, it is not intended to be limiting to the method and apparatus for forming semiconductor devices in present disclosure. For example, the raw sealant resin layer may alternatively formed so as not to be formed on the dicing lines, for example, as described earlier referring to FIGS. 6A, 6B, 8A and 8B.

FIGS. 10A through 10D are each cross-sectional views illustrating the method for manufacturing semiconductor devices during various stages in the process according to another embodiment disclosed herein. The apparatus shown in FIG. 2 is utilized also in the present embodiment as the apparatus for manufacturing the semiconductor devices. It may be noted that a discharging nozzles 11 is shown in the apparatus of FIGS. 10A through 10D and other portions are herein abbreviated.

Referring now to FIGS. 2, 10A through 10D, the method for manufacturing semiconductor devices will be described together with the description on the operation of the manufacturing apparatus.

(1) A semiconductor wafer substrate 1 is provided thereon with a metallized wiring layer 39 and a pad electrode 41, which are each formed on a first surface 1a of the substrate 1. A bump electrode 61 is additionally formed on top of the pad electrode 41. The thus prepared entire structure of the semiconductor wafer substrate 1 is subsequently placed on a substrate holding unit 3 with the first surface 1a up.

Figure 10A:
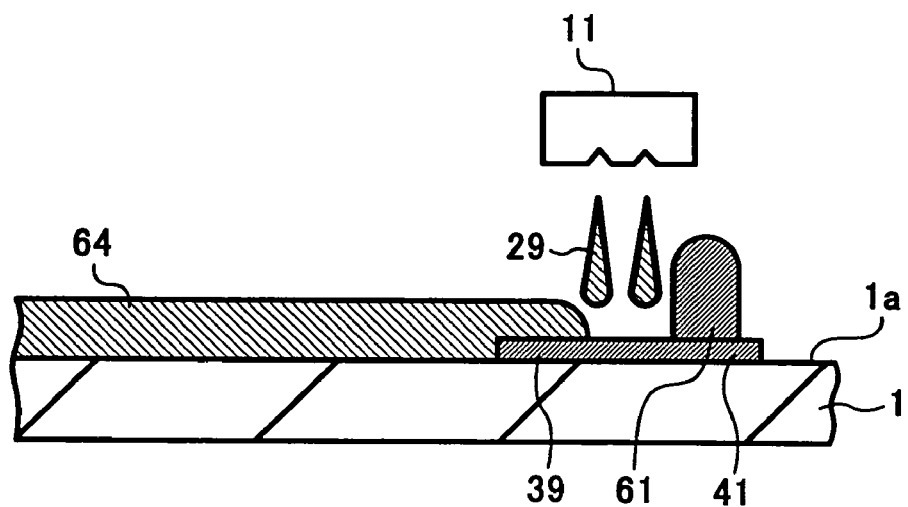
FIGS. 10A through 10D are each cross-sectional views illustrating the method for manufacturing semiconductor devices during various stages in the process according to another embodiment disclosed herein.
Figure 10B:
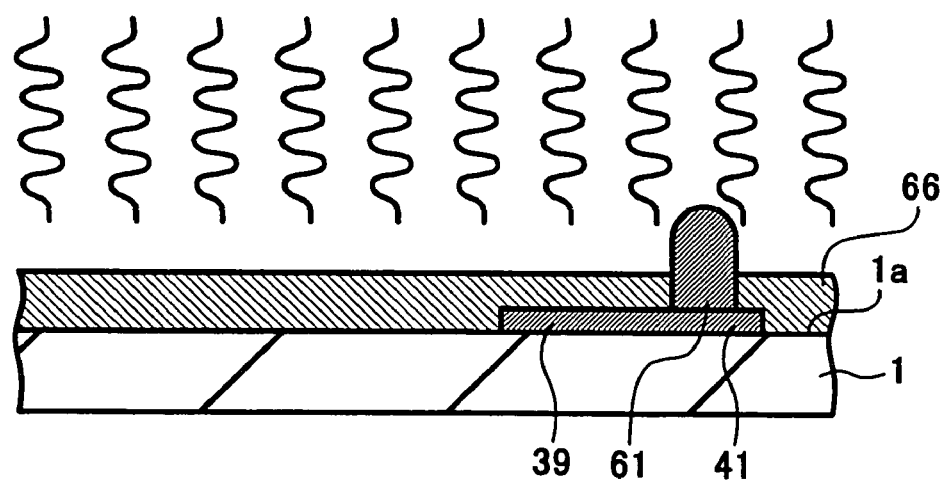

Following the calculation by the control unit 33, of the area of the semiconductor wafer substrate 1, onto which sealant resin is to be discharged, the movements of the stage unit 9 and discharging heads 11 are controlled, the discharge of raw sealant resin is initiated onto the surface 1a of the wafer substrate 1, whereby a raw sealant resin layer 64 having a thickness of approximately 20 μm is formed on the surface 1a of the wafer substrate 1 except the area for forming the bump electrode 61 (FIG. 10A).

(2) Following the formation of the raw sealant resin layer 64 on the surface 1a of the wafer substrate 1 except the area for forming the bump electrode 61, the wafer substrate 1 is subjected to heat treatment at 90° C. for 30 min to form a semi-hardened layer, whereby a semi-hardened sealant resin layer 66 is formed (FIG. 9B).

Figure 10C:
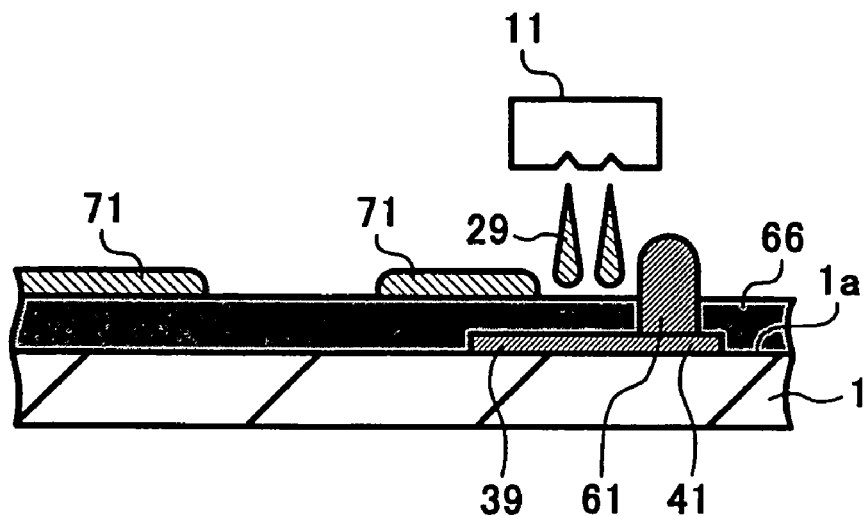

(3) Subsequently, by controlling the movements of the stage unit 9 and discharging heads 11, another raw sealant resin layer 71 is formed to a thickness of approximately 20 μm, for example, on top of the semi-hardened sealant resin layer 66 such that the finished sealant resin layer have a surface of predetermined structure such as uneven surface shape corresponding to, for example, an assembled wiring pattern on circuit board (FIG. 10C).

Figure 10D:
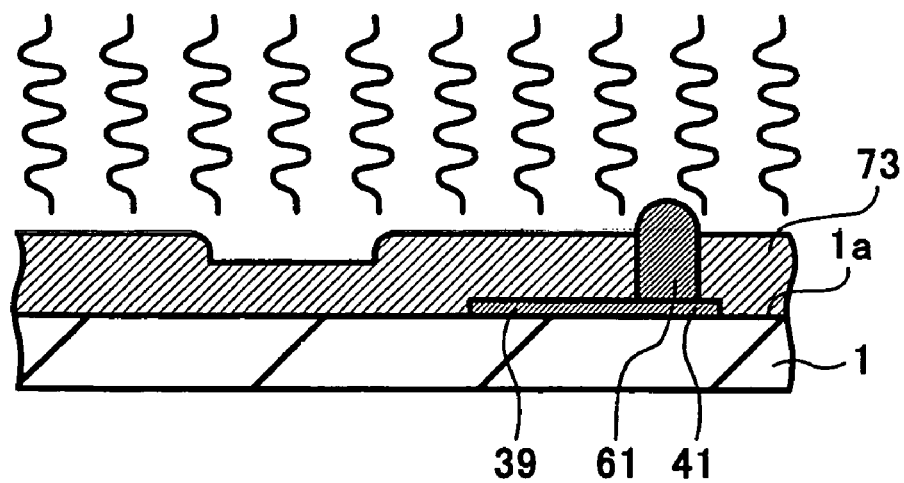

(4) Following the formation of the raw sealant resin layer 71 on the surface of predetermined shape and location, the wafer substrate 1 is removed from the substrate holding unit 3. The wafer substrate 1 is subsequently subjected to heat treatments, first at 120° C. for 30 min and then at 150° C. for 120 min, for thermosetting the semi-hardened sealant resin layer 66 and raw sealant resin layer 71, whereby a further sealant resin layer 73 is formed having the predetermined uneven surface structure (FIG. 10D). As disclosed above, by suitably choosing the location for forming an upper layer of the raw sealant resin, the sealant resin layer 73 can be formed having the surface of predetermined uneven structure.

Although the surface of predetermined uneven structure of the finished sealant resin layer is formed in the present embodiment by suitably choosing and adjusting the location for discharging the raw sealant resin layer 71 which is to be semi-hardened to form the sealant resin layer, it is not intended to be limiting to the method and apparatus for forming semiconductor devices in present disclosure.

For example, the predetermined uneven structure may alternatively be formed not by the sealant resin layer 71 but one or more layers overlying the layer 71. In addition, although the apparatus shown in FIG. 2 is utilized above, the apparatus of FIG. 4 may alternatively be used for manufacturing the semiconductor devices.

FIGS. 11A through 11D are each cross-sectional views illustrating the method for manufacturing semiconductor devices during various stages in the process according to another embodiment disclosed herein. The apparatus shown in FIG. 2 is utilized also in the present embodiment as the apparatus for manufacturing the semiconductor devices. It may be noted that a discharging nozzles 11 is shown in the apparatus of FIGS. 11A through 11D and other portions are herein abbreviated.

Referring now to FIGS. 2, 1A through 11D, the method for manufacturing semiconductor devices will be described together with the description on the operation of the manufacturing apparatus.

(1) A semiconductor wafer substrate 1 is provided thereon with a metallized wiring layer 39 and a pad electrode 41, which are each formed on a first surface 1a of the substrate 1. A bump electrode 43 is additionally formed on top of the pad electrode 41. The thus prepared entire structure of the semiconductor wafer substrate 1 is subsequently placed on a substrate holding unit 3 with the first surface 1a, facing up.

Figure 11A:
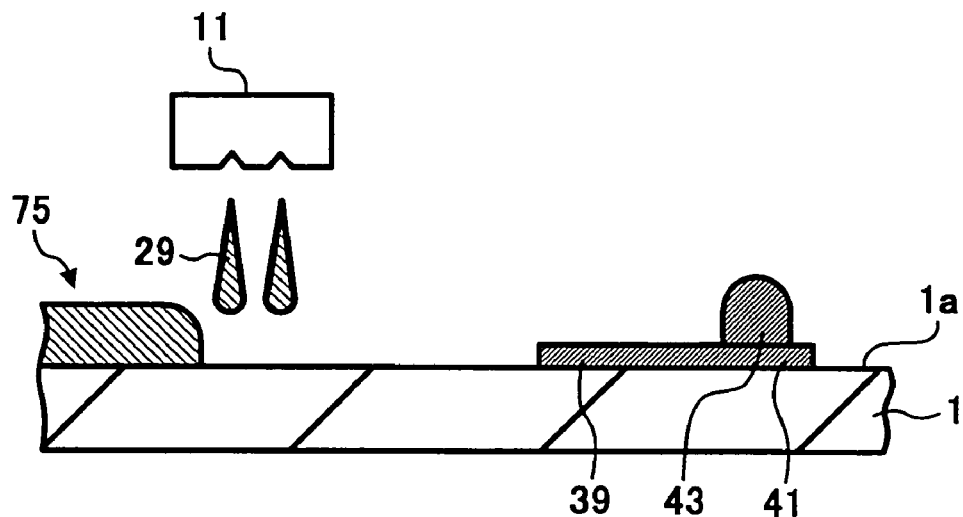
FIGS. 11A through 11D are each cross-sectional views illustrating the method for manufacturing semiconductor devices during various stages in the process according to another embodiment disclosed herein.

Following the calculation by the control unit 33, of the area of the semiconductor wafer substrate 1, onto which sealant resin is to be discharged, the movements of the stage unit 9 and discharging heads 11 are controlled and the discharge of raw sealant resin is initiated onto the surface 1a of the wafer substrate 1 (FIG. 11A).

(2) A raw sealant resin layer is formed by adjusting the thickness thereof at each location such that a finished sealant resin layer have a surface of predetermined structure having uneven surface shape corresponding to, for example, an assembled wiring pattern on circuit board.

In the present embodiment, for example, there formed through the control of movements of the stage unit 9 and discharging heads 11 are two kinds of regions of raw sealant resin layer 75 such as thick layer regions 75a with raw sealant resin of approximately 20 μm thick and thin layer regions 75b of approximately 10 μm thick.

Figure 11B:
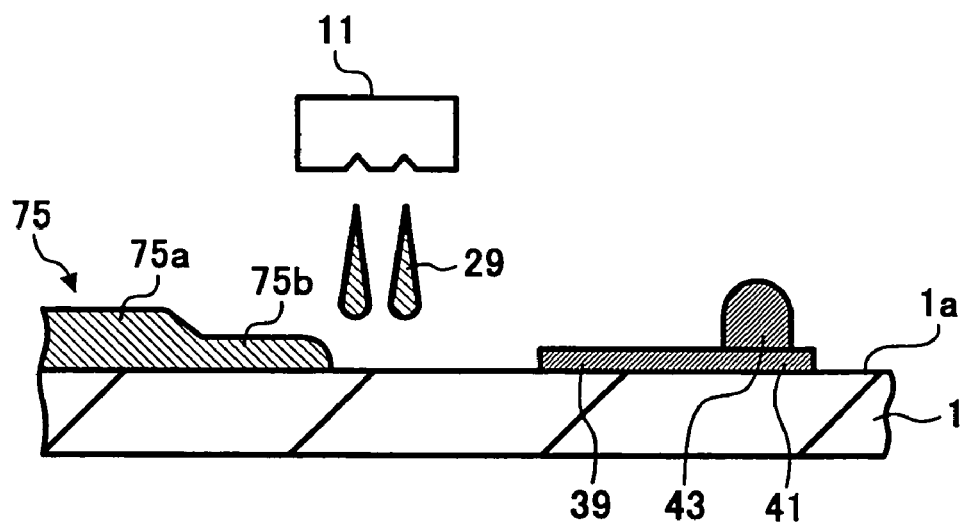

By thus making the thickness of raw sealant resin layer different, i.e., smaller for the regions 75b than the regions 75a, the thickness of the resulting layer can suitably adjusted at respective locations (FIG. 11B).

Figure 11C:
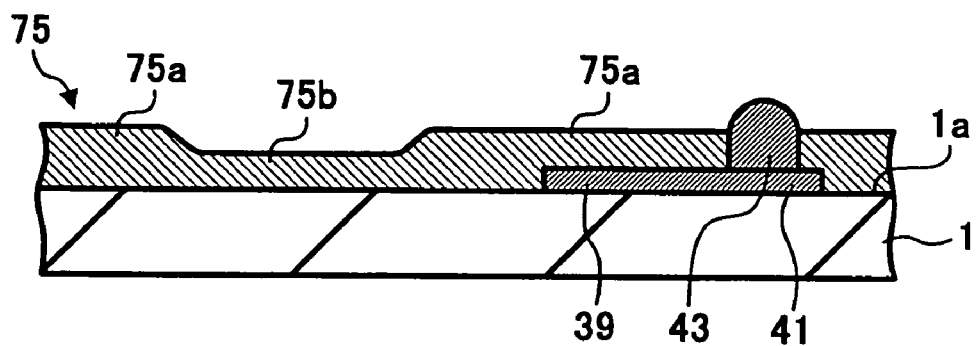

(3) By controlling the amount of raw sealant resin to be discharged at each location, a raw sealant resin layer 75 is formed on the surface 1a of the wafer substrate 1, having thick layer regions 75a and thin layer regions 75b (FIG. 11C).

Figure 11D:
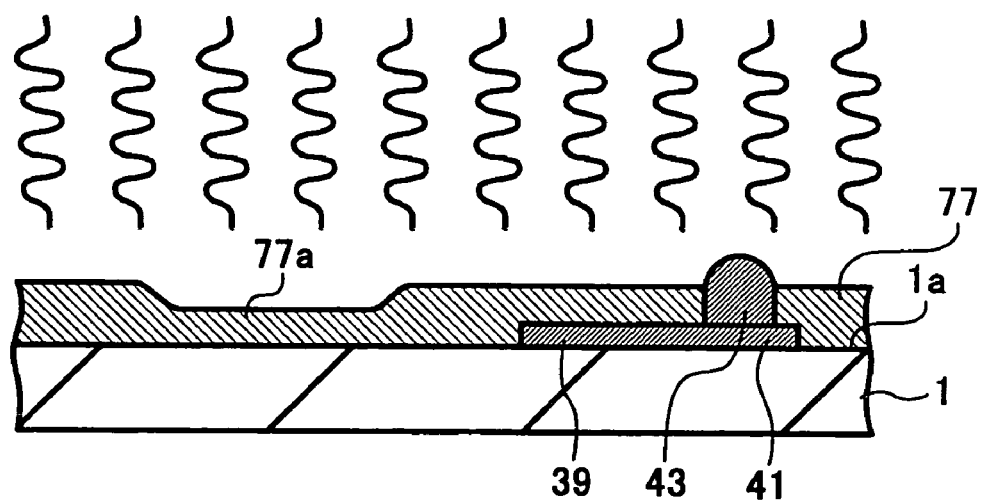

(4) After removed from the substrate holding unit 3, the wafer substrate 1 is subsequently subjected to heat treatments, first at 120° C. for 30 min and then at 150° C. for 120 min, for thermosetting the raw sealant resin layer 75, whereby a further sealant resin layer 77 is formed at the location corresponding to the thin layer regions 75b to a thickness of approximately 15 μm, having concave portions 77a of approximately 20 μm deep, for example (FIG. 11D).

As disclosed above, by suitably differentiating the amount of raw sealant resin during discharging steps depending on locations, the sealant resin layer can be formed having the predetermined surface structure such as, for example, uneven surface shape corresponding to assembled wiring pattern on circuit board. In addition, although the apparatus shown in FIG. 2 is utilized above, the apparatus of FIG. 4 may alternatively be used for manufacturing the semiconductor devices.

Although the protruded-shaped bump electrodes 43, 61 are shown herein above as the electrodes formed on the semiconductor wafer substrate 1, it is not intended to be limiting to the method and apparatus for forming semiconductor devices in present disclosure. For example, so called post electrodes such as those pillar-shaped formed of copper, for example, may alternatively be utilized in the method and apparatus for forming the semiconductor devices of the present disclosure.

In addition, the apparatus for forming the semiconductor devices of the present disclosure can be adopted to forming semiconductor devices, which are each provided with flat pad electrodes and sealant resin layer, formed on the surface of semiconductor wafer substrate, and openings of sealant resin layer, that are formed above the pad electrodes.

Furthermore, the method and apparatus for forming the semiconductor devices of the present disclosure can be applied to the formation of sealant resin layers on the surface of semiconductor wafer substrates which are each provided thereon with flat pad electrodes.

Figure 12A:
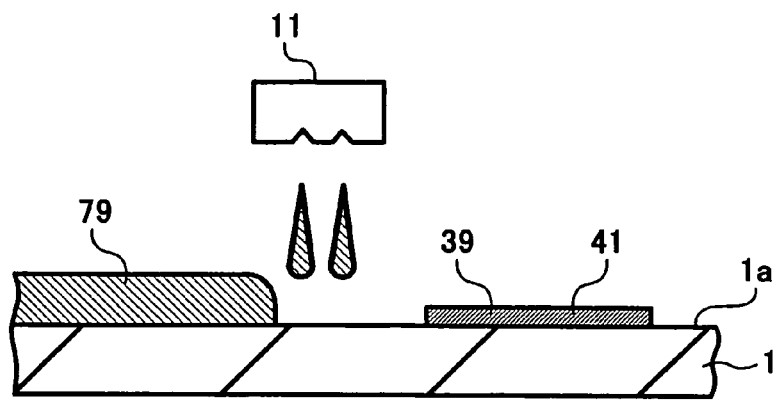
FIGS. 12A through 12C are each cross-sectional views illustrating the method for manufacturing semiconductor devices during various stages in the process according to another embodiment disclosed herein.
Figure 12B:
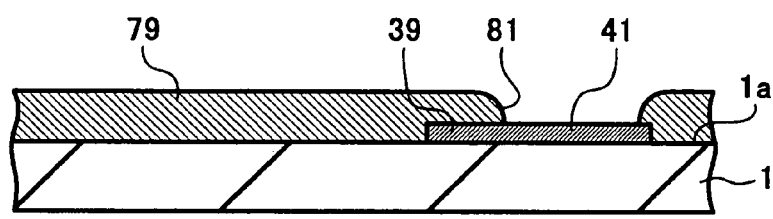
Figure 12C:
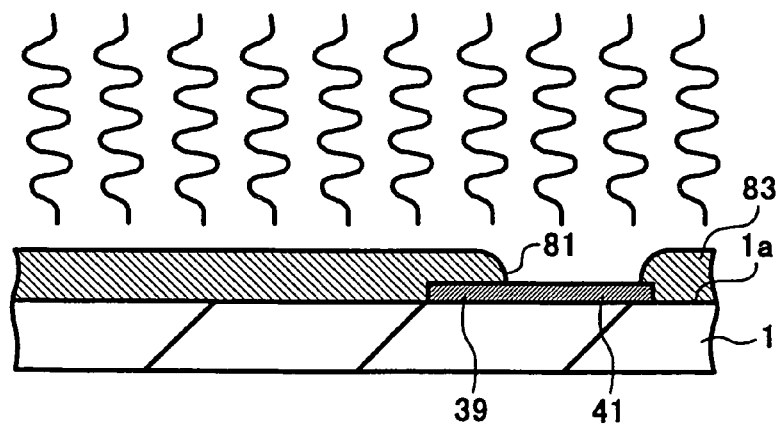

FIGS. 12A through 12C are each cross-sectional views illustrating the method for manufacturing semiconductor devices during various stages in the process according to another embodiment disclosed herein. The apparatus shown in FIG. 2 is utilized also in the present embodiment as the apparatus for manufacturing the semiconductor devices. It may be noted that a discharging nozzles 11 is shown in the apparatus of FIGS. 12A through 12C and other portions are herein abbreviated.

Referring now to FIGS. 2, 12A through 12C, the method for manufacturing semiconductor devices will be described together with the description on the operation of the manufacturing apparatus.

(1) A semiconductor wafer substrate 1 is provided thereon with a metallized wiring layer 39 and a pad electrode 41, which are each formed on a first surface 1a of the substrate 1. The thus prepared entire structure of the semiconductor wafer substrate 1 is subsequently placed on a substrate holding unit 3 with the first surface 1a up.

Following the calculation by the control unit 33, of the area of the semiconductor wafer substrate 1, onto which sealant resin is to be discharged, the movements of the stage unit 9 and discharging heads 11 are controlled and the discharge of raw sealant resin is initiated onto the surface 1a of the wafer substrate 1, to thereby form a raw sealant resin layer 79 (FIG. 12A).

(2) By suitably controlling the discharging heads 11 and discharging raw sealant resin onto the surface 1a of the wafer substrate 1, a raw sealant resin layer 79 of approximately 20 µm thick is formed on the surface 1a of the semiconductor wafer substrate 1, including the areas above metallized wiring layer 39 and on the circumference of the pad electrodes 41, and excluding the areas for pad openings 81 (FIG. 12B).

(3) Following the formation of raw sealant resin layer, the wafer substrate 1 is removed from the substrate holding unit 3. The wafer substrate 1 is subsequently subjected to heat treatments, first at 120° C. for 30 min and then at 150° C. for 120 min, for thermosetting the raw sealant resin layer 79, whereby a further sealant resin layer 83 is formed having openings 81 above the pad electrodes 41 (FIG. 12C).

As disclosed above, the sealant resin layer 83 is formed having openings 81 above the pad electrodes 41 according to the embodiment disclosed herein. Since this is achieved without well known etching process steps, the number of steps can be reduced, thereby facilitating for reducing manufacturing costs.

In addition, since the wasteful use of resinous material can be reduced compared with the method for forming the sealant resin layer by spin coating, manufacturing costs can be reduced with the present method. Still in addition, during the formation of the raw sealant resin layer 79 having openings 81 above the pad electrodes 41, two-discharging heads may be used each being capable of discharging different amount of raw sealant resin as described earlier referring to FIGS. 5A through 5C.

That is, for the area in vicinity of the pad openings 81, relatively precise boundary formation is carried out using one discharging head having the capability of discharging smaller liquid droplets, while the other discharging head having the capability of discharging larger liquid droplets is used for other areas, thereby improving the throughput for device fabrication.

Still alternatively, as described earlier referring to FIGS. 6A and 6B, the sealant resin layer may be formed on the surface 1a of the wafer substrate 1 except the top portion of the bump electrode 43 and center portions of dicing lines 51. As a result, the warping of the wafer substrate 1, which may be caused by stress, can be alleviated.

As described earlier referring to FIGS. 8A and 8B, a sealant resin layer 55 is thus formed on the surface 1a of the wafer substrate 1 except the areas of the bump electrode 43, all dicing lines 51 and in the vicinity of intersecting points of the dicing lines, thereby alleviating the occurrence of warping of the wafer substrate 1, which may be caused by stress.

Figure 13A:
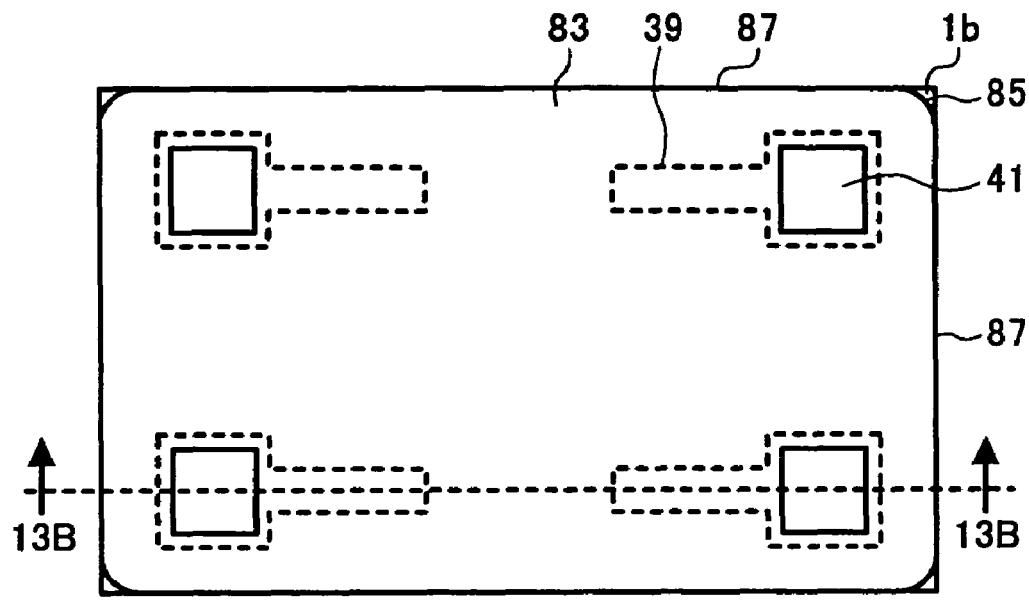
FIG. 13A is a top view of a portion of a semiconductor wafer substrate 1b according to another embodiment disclosed herein.
Figure 13B:
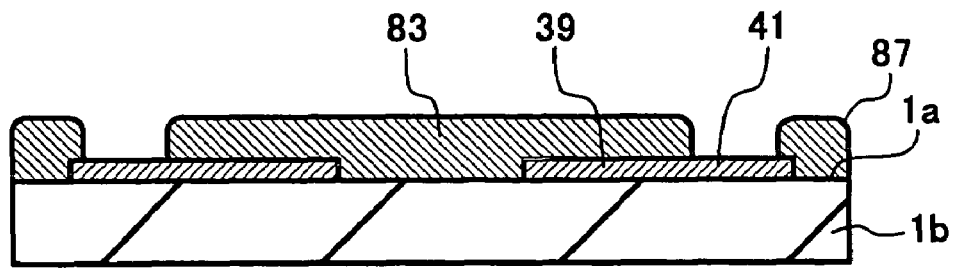
FIG. 13B is a cross-sectional view taken along the line 13B-13B of the structure of FIG. 13A.

In the thus formed semiconductor devices, rounded corners are formed at four corners 85 and at the upper edge portions 87 of the sealant resin layer 83 as viewed along the extension of the side lines of the upper edge portions as shown in FIGS. 13A and 13B. As a result, chipping off of the resin layer can be alleviated during either dicing steps or conveying steps following the carving out of the semiconductor devices.

Alternatively, as described earlier referring to FIGS. 9A through 9D, after forming a raw sealant resin layer on the area except pad opening forming area 81 on the surface 1a of the wafer substrate 1, the raw sealant resin layer is thermo-set to form a semi-hardened sealant resin layer. Thereafter, a further raw sealant resin layer can be formed on the semi-hardened sealant resin layer. As a result, the thickness of resultant layer can be increased.

Furthermore, in a similar manner to that described earlier referring to FIGS. 10A through 10D, after forming a raw sealant resin layer on the area except pad opening forming area 81 on the surface 1a of the wafer substrate 1, the raw sealant resin layer is thermo-set to form a semi-hardened sealant resin layer. Thereafter, a further raw sealant resin layer may be formed on the semi-hardened sealant resin layer. As a result, the sealant resin layer can be formed having the predetermined uneven surface structure.

Alternatively, in a similar manner to that described earlier referring to FIGS. 11A through 11D, by suitably differentiating the amount of raw sealant resin during discharging steps depending on the location on the surface 1a of the wafer substrate 1 excluding the area for forming the pad openings 81, the sealant resin layer can be formed having the predetermined surface structure.

While the present disclosure has been described in connection with preferred embodiments, it will be understood that it is not intended to limit the disclosure to these embodiments. On the contrary, it is intended to cover alternatives.

For example, although a thermosetting resin is used as the raw sealant resin in the present disclosures, other sealant resin such as a photo-curing resin or UV (ultra-violet light) curing resin may alternatively be used. In such a case, curing steps suitable for the resin can be adopted, such as light beam irradiation for the photo-curing resin, for example.

Although there controlled in the present disclosures are the temperatures in the resin container unit 15, fluid feeding path 17, discharging vessel 19, in the discharging heads 11, 49, to thereby properly control the temperature of the surface 1a of wafer substrate 1, the steps may not be necessary for certain apparatus and method for forming semiconductor devices, as long as the resin material presently in use retains suitable viscosity without any temperature control.

In addition, the discharging heads 11, 49 are provided with the position thereof being fixed and then positioned by properly displacing the substrate holding unit 3 in the embodiments described earlier referring to FIGS. 2 and 4.

The apparatus of the disclosure may alternatively be provided with other structure, in which either the discharging heads or both discharging heads and substrate holding unit can be displaced.

Still in addition, although the piezoelectric type discharging head such as the noted discharging head 11 is used for discharging liquid droplets of raw sealant resin herein above, the apparatus for manufacturing the devices may alternatively be provided with other type discharging heads such as, for example, ones of thermal jet type utilizing the vapor pressure generated from liquid through rapid heating, and of electromagnetic type operating valves electromagnetically.

Although the discharging head described earlier has the structure similar to printer head for use in ink jet printers, discharging heads of any other type may alternatively be used as long as the heads are capable of discharging liquid droplets of raw sealant resin onto the surface of wafer substrate.

In addition, although the resin container unit 15 is provided for each discharging nozzle for containing the raw sealant resin, the container unit may alternatively be provided in common for plural discharging nozzles. Further, although plural nozzles are formed in one discharging head as noted earlier, the discharging head may alternatively be provided with one nozzle.

In addition, the semiconductor wafer substrate 1 is not limited to the type shown in the drawings throughout the embodiments. For example, a wafer substrate having dicing grooves (half-dicing type) may alternatively be used in the apparatus for manufacturing the semiconductor devices disclosed herein.

It is apparent from the above description including the examples, the apparatus and method disclosed herein have several advantages over similar apparatuses and methods previously known. Although some are described earlier in the text, several points are summarized as follows.

With the apparatus and method disclosed herein, for example, since the raw sealant resin layer is formed except the portion for the electrode, the manufacturing costs can be reduced. In addition, since the amount of the resinous material to be discharged onto the surface of the wafer substrate can suitably be controlled depending on the portion thereof specifically, the precise control of the thickness of the sealant resin layer can be achieved with more ease.

It should be noted these control of the raw sealant resin layer are suitably achieved by means of several components included in the apparatus such as, for example, the discharging mechanism with the plurality of discharging nozzles and discharging heads capable of discharging different amount of raw sealant resin, and the temperature control mechanism for suitably controlling the temperatures of the raw sealant resin.

In addition, the control unit is adapted to assume the control of at least the discharging mechanism and temperature control mechanism such that the raw sealant resin is properly discharged onto the first surface of semiconductor wafer substrate.

The sealant resin layer can be formed having openings above the pad electrodes and this can be achieved without well known etching process steps.

In addition, for the area in vicinity of the pad openings, relatively precise boundary formation can be carried out using one discharging head having the capability of discharging smaller liquid droplets, while the other discharging head having the capability of discharging larger liquid droplets is used for other areas.

The number of steps can therefore be reduced and the wasteful use of resinous material can be reduced compared with the method for forming the sealant resin layer by spin coating. As a result, the throughput for semiconductor device fabrication is improved and manufacturing costs can be reduced.

Furthermore, after forming a raw sealant resin layer on the area except that of the pad opening on the surface of the wafer substrate, the raw sealant resin layer may be thermo-set to form a semi-hardened sealant resin layer. Thereafter, a further raw sealant resin layer can be formed on the semi-hardened sealant resin layer. As a result, the thickness of resultant layer can be increased.

By the substrate temperature control mechanism included in the apparatus, the viscosity of the raw sealant resin attached to the surface of wafer substrate can suitably controlled.

As a result, there achieved are improved surface flatness of the layer of raw sealant resin, proper filling of raw sealant resin into minute structural portions of the wafer substrate, and control of the thickness of the layer of raw sealant resin.

In addition, predetermined uneven surface structure can be formed with the apparatus and method disclosed herein. Namely, after forming a raw sealant resin layer on the area except that of the pad opening on the surface of wafer substrate, the raw sealant resin layer is thermo-set to form a semi-hardened sealant resin layer, and a further raw sealant resin layer may thereafter be formed on the semi-hardened sealant resin layer.

Alternatively, by suitably differentiating the amount of raw sealant resin during discharging steps depending on the location on the surface of the wafer substrate excluding the area for forming the pad openings, the raw sealant resin layer can be formed and subsequently hardened.

Furthermore, since the sealant resin layer is formed on the surface of the wafer substrate except the areas of the bump electrode, all dicing lines and in the vicinity of intersecting points of the dicing lines, the occurrence of warping of the wafer substrate 1, which may be caused by stress, can be alleviated.

In addition, rounded corners may be provided at four corners and at the upper edge portions of the sealant resin layer as viewed along the extension of the side lines of the upper edge portions. As a result, chipping off of the resin layer can be alleviated during either dicing steps or conveying steps following the carving out of the semiconductor devices.

For the semiconductor device disclosed herein, the sealant resin layer can be formed using the present apparatus on the surface of semiconductor wafer substrate such that a portion of the electrode is excluded from the formation of the sealant resin layer and that edge portions of the sealant resin layer are formed with a rounded shape. As a result, chipping off of the resin layer can be alleviated during either dicing steps or conveying steps following the carving out of the semiconductor devices.

The process steps set forth in the present description on the formation of sealant resin layers on the surface of wafer substrate may be implemented using conventional general purpose microprocessors, programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification thus include also a computer-based product which may be hosted on a storage medium, and include instructions which can be used to pro/gram a microprocessor to perform a process in accordance with the present disclosure. This storage medium can include, but not limited to, any type of disc including floppy discs, optical discs, CD-ROMs, magneto-optical discs, ROMs, RAMs, EPROMs, EEPROMs, flash memory, magnetic or optical cards, or any type of media suitable for storing electronic instructions.

Additional modifications and variations of the present invention are possible in light of the above teachings. It is therefore to be understood that within the scope of the appended claims, the invention may be practiced other than as specifically described herein.

What is claimed as new and desired to be protected by Letters Patent of the United States is:

1. A method for manufacturing a semiconductor device, comprising:
   resin sealing a semiconductor wafer substrate, said semiconductor wafer substrate provided with at least one electrode formed on a first surface thereof and said resin sealing comprising:

scanning a discharging nozzle for discharging droplets of raw sealant resin while suitably discharging said droplets;

forming a layer of said raw sealant resin on said first surface of said semiconductor wafer substrate such that a portion of said electrode is excepted from said layer, said step of forming said layer of raw sealant resin including discharging droplets of raw sealant resin of an amount smaller for an area in a vicinity of said electrode than other portions of said semiconductor wafer substrate and forming said layer over said substrate with the exception of at least a portion of dicing lines of said semiconductor wafer substrate; and forming a sealant resin layer by hardening said layer of raw resin sealant.

2. The method for manufacturing a semiconductor device according to claim 1, wherein said electrode formed on said first surface of said semiconductor wafer substrate is a protruded-shaped electrode, and wherein said step of forming said layer includes forming except a tip portion of said protruded-shaped electrode.

3. The method for manufacturing a semiconductor device according to claim 1, wherein said step of forming said layer of raw sealant resin includes forming said layer such that the layer has a rounded shape in vicinity of intersecting points of said dicing lines.

4. The method for manufacturing a semiconductor device according to claim 1, wherein said step of forming said layer of raw sealant resin includes forming said layer by discharging droplets of raw sealant resin of an amount suitably differentiated depending on the location on said surface of said wafer substrate.

5. The method for manufacturing a semiconductor device according to claim 1, wherein said step of forming said layer of raw sealant resin includes:

forming said layer of raw sealant resin;

hardening said layer of raw sealant resin to form a first semi-hardened sealant resin layer;

repeating at least once a further step of forming a further raw sealant resin layer and hardening said further raw sealant resin layer to form a further semi-hardened sealant resin layer; and hardening said first semi-hardened sealant resin layer and said further semi-hardened sealant resin layer altogether.

* * * * *

UNITED STATES PATENT AND TRADEMARK OFFICE
CERTIFICATE OF CORRECTION

| | |
|---|---|
| PATENT NO. | : 7,651,724 B2 |
| APPLICATION NO. | : 11/399315 |
| DATED | : January 26, 2010 |
| INVENTOR(S) | : Kazunari Kimino |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 562 days.

Signed and Sealed this

Twenty-eighth Day of December, 2010

David J. Kappos
*Director of the United States Patent and Trademark Office*